(12) United States Patent
Hanamura et al.

(10) Patent No.: US 8,486,604 B2
(45) Date of Patent: Jul. 16, 2013

(54) POSITIVE-TYPE RADIATION-SENSITIVE COMPOSITION, CURED FILM, INTERLAYER INSULATING FILM, METHOD OF FORMING INTERLAYER INSULATING FILM, DISPLAY DEVICE, AND SILOXANE POLYMER FOR FORMING INTERLAYER INSULATING FILM

(75) Inventors: Masaaki Hanamura, Tokyo (JP); Daigo Ichinohe, Tokyo (JP); Hideaki Takase, Tokyo (JP)

(73) Assignee: JSR Corporation, Tokyo (JP)

(*) Notice: Subject to any disclaimer, the term of this patent is extended or adjusted under 35 U.S.C. 154(b) by 299 days.

(21) Appl. No.: 12/826,049

(22) Filed: Jun. 29, 2010

(65) Prior Publication Data

US 2011/0008730 A1    Jan. 13, 2011

(30) Foreign Application Priority Data

Jun. 29, 2009  (JP) .................................. 2009-154416
May 17, 2010  (JP) .................................. 2010-113006

(51) Int. Cl.
*G03F 7/023*    (2006.01)
*C08G 77/18*    (2006.01)

(52) U.S. Cl.
CPC .............. *G03F 7/0233* (2013.01); *C08G 77/18* (2013.01)
USPC ............. 430/191; 430/18; 430/192; 430/193; 525/132; 525/137; 528/43

(58) Field of Classification Search
CPC ............................... G03F 7/0233; C08G 77/18
USPC ................ 430/18, 165, 191, 192, 193, 270.1; 528/43; 525/132, 137
See application file for complete search history.

(56) References Cited

U.S. PATENT DOCUMENTS

| 4,722,881 | A | * | 2/1988 | Ueno et al. ..................... 430/192 |
| 5,252,686 | A | * | 10/1993 | Aoai et al. ..................... 525/480 |
| 5,372,908 | A | * | 12/1994 | Hayase et al. ................. 430/192 |
| 5,624,788 | A | * | 4/1997 | Murai et al. ................ 430/270.1 |
| 5,773,192 | A | * | 6/1998 | Murai et al. ................ 430/270.1 |
| 7,193,026 | B2 | * | 3/2007 | Itagaki et al. ................... 528/23 |
| 7,374,856 | B2 | * | 5/2008 | Suwa et al. ..................... 430/169 |

FOREIGN PATENT DOCUMENTS

| JP | 2001-354822 | 12/2001 |
| JP | 2003-288991 | 10/2003 |
| JP | 2006-178436 | 7/2006 |
| JP | 2006-276598 | 10/2006 |
| JP | 2006-293337 | 10/2006 |

* cited by examiner

*Primary Examiner* — John Chu
(74) *Attorney, Agent, or Firm* — Oblon, Spivak, McClelland, Maier & Neustadt, L.L.P.

(57) ABSTRACT

The present invention provides a positive-type radiation-sensitive composition containing (A) a siloxane polymer, and (B) a quinone diazide compound, in which the content of aryl groups relative to Si atoms in the siloxane polymer (A) is greater than 60% by mole and no greater than 95% by mole.

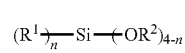

(1)

19 Claims, No Drawings

POSITIVE-TYPE RADIATION-SENSITIVE COMPOSITION, CURED FILM, INTERLAYER INSULATING FILM, METHOD OF FORMING INTERLAYER INSULATING FILM, DISPLAY DEVICE, AND SILOXANE POLYMER FOR FORMING INTERLAYER INSULATING FILM

TECHNICAL FIELD

The present invention relates to a positive-type radiation-sensitive composition suitable as a material for forming a cured film of an interlayer insulating film and the like of a display device such as a liquid crystal display (LCD) device and an organic EL display device, a cured film or an interlayer insulating film formed from the composition, a method of forming the interlayer insulating film, and a siloxane polymer for forming an interlayer insulating film.

BACKGROUND OF THE INVENTION

Color TFT liquid crystal display devices and the like are produced by laminating a color filter substrate and a TFT array substrate. TFT array substrates are generally provided with an interlayer insulating film for insulation between wirings disposed in layers. As a material for forming the interlayer insulating film, a positive-type radiation-sensitive composition has been widely used since the number of steps for obtaining a required pattern configuration can be diminished, and additionally an interlayer insulating film having sufficient flatness is preferred.

As a component of such a radiation sensitive composition for forming an interlayer insulating film, acrylic resins have been primarily used (see, JP-A No. 2001-354822 (the term "JP-A" as used herein means an "unexamined published Japanese Patent Application")). To the contrary, attempts have been made to use as a component of the radiation sensitive composition a polysiloxane-based material that is superior in heat resistance and transparency than acrylic resins (see, JP-A No. 2006-178436, JP-A No. 2006-276598, and JP-A No. 2006-293337). Siloxane polymers used in conventional polysiloxane-based radiation sensitive compositions are obtained by subjecting a silane compound such as phenyltrimethoxysilane to hydrolytic condensation. In order to keep the surface hardness of the cured film obtained from a radiation sensitive composition containing such a siloxane polymer at a level appropriate in practical applications, it is important to control the amount of a silane compound having phenyl groups such as phenyltrimethoxysilane used in the synthesis of the siloxane polymer. It is reported that when the content of phenyl groups relative to Si atoms in a siloxane polymer is greater than 60% by mole, the surface hardness of the cured film is lowered (for example, see JP-A No. 2006-178436).

However, when the content of the phenyl groups relative to Si atoms in the siloxane polymer is adjusted to be from 5% by mole to no greater than 60% by mole only for the purpose of improving the surface hardness of the cured film, the following problems may occur. For example, a decrease in the content of phenyl groups results in lowering of the refractive index of the cured film, thereby contributing to lowering of the luminance of liquid crystal panels. Furthermore, in the case of positive-type radiation-sensitive compositions, since a siloxane polymer having a low content of phenyl groups is poorly compatible with a quinone diazide compound added as a photosensitizing agent, whitening of the cured film (opacification of the cured film that occurs by phase separation of the siloxane polymer and a quinone diazide compound) may be caused.

When the content of phenyl groups relative to Si atoms in the siloxane polymer is from 5% by mole to no greater than 60% by mole, in addition to the aforementioned problems, deterioration of durability of the cured film against a resist remover solution used in an ITO etching step becomes a great problem. In producing a TFT array substrate, following formation of an interlayer insulating film, an ITO (indium tin oxide) film is formed thereon to cover the entire face of the substrate. Thereafter, in order to remove unnecessary portions of the ITO film at, an etching liquid such as strong acid is used to carry out etching of the ITO film. Upon etching of the ITO film, necessary portions of the ITO film is protected using a novolak-based positive resist or the like so as not to etch necessary portions of the ITO film. Thereafter, the positive resist is removed by a resist remover solution. In this step, when the interlayer insulating film was formed from a siloxane polymer having a low content of phenyl groups, swelling and/or erosion of the cured film is caused by the resist remover solution, and thus alteration of the film thickness occurs between before and after the ITO etching step. The alteration of the film thickness of the cured film leads to a defective cell gap of the liquid crystal display device, which in turn causes nonuniformity of the display in the liquid crystal display device.

Additionally, in JP-A No. 2003-288991, for example, a radiation sensitive composition for forming an insulating film of organic EL display device, which contains a certain silane compound, and a compound that generates an acid or a base upon irradiation with a radiation is disclosed. However, no disclosure is found indicating that by controlling the amount of the silane compound having phenyl groups used, various performances such as heat resistance, transparency and low dielectricity generally demanded for interlayer insulating film can be improved, and in addition, refractive index, and resist remover solution resistance as well as dry etching resistance in ITO film etching steps can be particularly improved.

Under such circumstances, the development of a polysiloxane-based positive-type radiation-sensitive composition has been strongly desired, which is capable of forming a cured film having high heat resistance, transparency, and low dielectricity that are generally demanded for interlayer insulating films, as well as superior refractive index and resist remover solution resistance in ITO film etching steps, and also capable of forming a liquid crystal cell having a high voltage holding ratio, and also having high radiation sensitivity and high compatibility with quinone diazide compounds.

PRIOR ART DOCUMENTS

Patent Documents

[Patent Document 1] JP-A No. 2001-354822
[Patent Document 2] JP-A No. 2006-178436
[Patent Document 3] JP-A No. 2006-276598
[Patent Document 4] JP-A No. 2006-293337
[Patent Document 5] JP-A No. 2003-288991

SUMMARY OF THE INVENTION

Problems to be Solved by the Invention

The present invention was made in view of the foregoing situations, and an object of the invention is to provide a polysiloxane-based positive-type radiation-sensitive composition which is capable of forming an interlayer insulating film having heat resistance, transparency, and low dielectricity, as well as superior refractive index and resist remover solution resistance in ITO film etching steps, and also capable of forming a liquid crystal cell having a high voltage holding ratio, and which has high radiation sensitivity and high compatibility with quinone diazide compounds, and also provide an interlayer insulating film formed from the composition, as well as a method of forming the interlayer insulating film.

Means for Solving the Problems

An aspect of the invention made for solving the foregoing problems provides a positive-type radiation-sensitive composition containing
(A) a siloxane polymer, and
(B) a quinone diazide compound, whirein
the content of aryl groups relative to Si atoms in the siloxane polymer (A) is greater than 60% by mole and no greater than 95% by mole.

The positive-type radiation-sensitive composition is capable of forming an interlayer insulating film for a display device that is superior in heat resistance, transparency, and low dielectricity, as well as superior in refractive index, resist remover solution resistance in ITO film etching steps, and dry etching resistance, since the content of aryl groups relative to Si atoms in the siloxane polymer (A) is greater than 60% by mole and no greater than 95% by mole. Concurrently, the positive-type radiation-sensitive composition has superior radiation sensitivity, and superior compatibility with quinone diazide compounds. In addition, by using the positive-type radiation-sensitive composition, the formation of a liquid crystal cell having a high voltage holding ratio is enabled.

The siloxane polymer (A) of the positive-type radiation-sensitive composition is preferably a hydrolysis-condensation product of a hydrolyzable silane compound containing at least a compound represented by the following formula (1):

(1)

wherein, $R^1$ each independently represents any one of a hydrogen atom, an alkyl group having 1 to 10 carbon atoms, an alkenyl group having 2 to 10 carbon atoms, and an aryl group having 6 to 15 carbon atoms; $R^2$ each independently represents any one of a hydrogen atom, an alkyl group having 1 to 6 carbon atoms, an acyl group having 1 to 6 carbon atoms, and an aryl group having 6 to 15 carbon atoms, where a part or all of hydrogen atoms of the alkyl group, alkenyl group, and alkyl group in $R^1$ and $R^2$ may be substituted; and n represents an integer of 0 to 3.

In the positive-type radiation-sensitive composition, use of the hydrolysis-condensation product of a hydrolyzable silane compound represented by the above formula (1) as the siloxane polymer (A) further improves radiation sensitivity of the positive-type radiation-sensitive composition, and also enables formation of an interlayer insulating film that is superior in heat resistance and transparency.

It is preferred that the siloxane polymer (A) be a hydrolysis-condensation product of
(i) a compound represented by the above formula (1), wherein: $R^1$ is an aryl group having 6 to 15 carbon atoms; $R^2$ is any of a hydrogen atom, an alkyl group having 1 to 6 carbon atoms, and an acyl group having 1 to 6 carbon atoms; and n represents an integer of 1 to 3, and
(ii) a compound represented by the above formula (1), wherein: $R^1$ is any one of a hydrogen atom, an alkyl group having 1 to 10 carbon atoms, and an alkenyl group having 2 to 10 carbon atoms; $R^2$ is any one of a hydrogen atom, an alkyl group having 1 to 6 carbon atoms, and an acyl group having 1 to 6 carbon atoms; and n represents an integer of 0 to 3. By using a compound having such a specific structure, the content of aryl groups relative to Si atoms can be easily controlled.

It is preferred that the positive-type radiation-sensitive composition further contains (C) a thermosensitive acid generator or a thermosensitive base generator. By using such a thermosensitive acid or base generator, a condensation reaction of the component (A) (and (D) a thermally crosslinkable compound, which may be optionally employed) in the heating step after developing the positive-type radiation-sensitive composition is further accelerated, thereby capable of forming an interlayer insulating film that is superior in the surface hardness and heat resistance.

It is preferred that the positive-type radiation-sensitive composition further contains (D) a thermally crosslinkable compound. By using such a thermally crosslinkable compound, a condensation reaction (crosslinking) of the component (A) in the heating step after developing the positive-type radiation-sensitive composition is still further accelerated, thereby enabling an interlayer insulating film to be formed having further improved surface hardness and heat resistance.

The positive-type radiation-sensitive composition of the present invention is suitably used for forming a cured film, whereby a cured film having improved surface hardness and heat resistance can be obtained.

In addition, a method of forming an interlayer insulating film for a display device of the present invention includes the steps of:
(1) forming a coating film of the positive-type radiation-sensitive composition on a substrate;
(2) irradiating at least a part of the coating film formed in the step (1) with a radiation;
(3) developing the coating film irradiated with a radiation in the step (2); and
(4) heating the coating film developed in the step (3).

In the method, formation of a pattern using the positive-type radiation-sensitive composition having superior radiation sensitivity by utilizing radiation sensitivity through exposure, development and heating enables an interlayer insulating film, which has fine and accurate pattern, for a display device to be easily formed. In addition, thus formed interlayer insulating film is superior in generally demanded characteristics, i.e., heat resistance, transparency, and low dielectricity, as well as refractive index, compatibility with quinone diazide compounds, and resist remover solution resistance in ITO film etching steps, and is also capable of forming a liquid crystal cell having a high voltage holding ratio. Meanwhile, the display device of the present invention is provided with an interlayer insulating film formed from the positive-type radiation-sensitive composition. Thus, general characteristics as a display device which are demanded in aspects of practical applications are thereby satisfied.

Since the cured film of the present invention obtained using the siloxane polymer having a content of aryl groups relative to Si atoms being greater than 60% by mole and no greater than 95% by mole is superior in mechanical and electrical characteristics, it is suitably used in forming an interlayer insulating film.

EFFECT OF THE INVENTION

As described hereinabove, the positive-type radiation-sensitive composition of the present invention has high radiation sensitivity. Also, since the aforementioned compounds (A) and (B) are contained, formation of an interlayer insulating film for a display device that achieves generally demanded characteristics, i.e., heat resistance, transparency and low dielectricity in a well balanced manner, and that is superior in refractive index and resist remover solution resistance in ITO film etching steps, dry etching resistance, as well as a liquid crystal cell having a high voltage holding ratio is enabled. Moreover, the positive-type radiation-sensitive composition of the present invention can be suitably used also for forming an interlayer insulating film of organic EL devices, and flexible displays etc., such as electronic papers.

DETAILED DESCRIPTION OF THE INVENTION

The positive-type radiation-sensitive composition of the present invention contains (A) a siloxane polymer, (B) a quinone diazide compound and other optional component(s) (i.e., (C) a thermosensitive acid generator or a thermosensitive base generator, (D) a thermally crosslinkable compound, etc.).

<Component (A): Siloxane Polymer>

The siloxane polymer as a component (A) is a polymer of a compound having a siloxane bond, and is not particularly limited as long as the content of aryl groups relative to Si atoms in the siloxane polymer (A) is greater than 60% by mole and no greater than 95% by mole. This component (A) constitutes a cured film such as an interlayer insulating film via condensation in a coating film formation step (prebaking step) and heating step (post-baking step) for forming the interlayer insulating film. When a thermosensitive acid generator or a thermosensitive base generator described later that is an optional component is added to the radiation sensitive composition, an acidic active substance or a basic active substance is generated in the heating step, and this active substance serves as a catalyst to further accelerate the condensation of the component (A).

The content of aryl groups relative to Si atoms in the siloxane polymer of the component (A) is greater than 60% by mole and no greater than 95% by mole. By adjusting the content of the aryl groups in the siloxane polymer as the component (A) to fall within such a range in the positive-type radiation-sensitive composition, compatibility of the component (A) with the quinone diazide compound as the component (B) described later can be improved, and in addition, formation of an interlayer insulating film having markedly improved refractive index and resist remover solution resistance in ITO film etching steps is enabled. It should be noted that the content of the aryl groups relative to Si atoms in the siloxane polymer can be determined by carrying out $^{29}$Si— NMP measurement of the siloxane polymer, based on the peak area ratio of thus obtained spectrum.

Still more preferred mode of the siloxane polymer as the component (A) includes a siloxane polymer that is a hydrolysis-condensation product of a hydrolyzable silane compound at least including the compound represented by the above formula (1). In addition, the "hydrolysis-condensation product of a hydrolyzable silane compound" referred to herein means a hydrolysis-condensation product produced by a reaction of silanol groups of a part of the hydrolyzed silane compound of the compound represented by the above formula (1) to permit condensation with each other, or a hydrolysis-condensation product produced by a reaction of silanol groups of a part of the hydrolyzed silane compound of the compound represented by the above formula (1) to permit condensation with silanol groups of a part of the hydrolyzed silane compound of the "other hydrolyzable silane compound" described later. The "other hydrolyzable silane compound" is not particularly limited as long as it is hydrolyzed to produce a silanol group.

In the hydrolyzable silane compound of the above formula (1), $R^1$ each independently represents any one of a hydrogen atom, an alkyl group having 1 to 10 carbon atoms, an alkenyl group having 2 to 10 carbon atoms, and an aryl group having 6 to 15 carbon atoms. In addition, a part or all of hydrogen atoms of any one of the alkyl group, the alkenyl group, and the aryl group may be either substituted or not substituted. Examples of the alkyl group include a methyl group, an ethyl group, a n-propyl group, an i-propyl group, a n-butyl group, a t-butyl group, a n-hexyl group, a n-decyl group, a trifluoromethyl group, a 3,3,3-trifluoropropyl group, a 3-glycidoxypropyl group, a 2-(3,4-epoxycyclohexyl)ethyl group, a 3-aminopropyl group, a 3-mercaptopropyl group, and a 3-isocyanatepropyl group. Examples of the alkenyl group include a vinyl group, a 3-acryloxypropyl group, and a 3-methacryloxypropyl group. Examples of the aryl group include a phenyl group, a tolyl group, a p-hydroxyphenyl group, a 1-(p-hydroxyphenyl)ethyl group, a 2-(p-hydroxyphenyl)ethyl group, a 4-hydroxy-5-(p-hydroxyphenylcarbonyloxy)pentyl group, and a naphthyl group. It should be noted that the aryl group according to the concept herein involves aralkyl groups.

$R^2$ in the above formula (1) each independently represents any one of a hydrogen atom, an alkyl group having 1 to 6 carbon atoms, an acyl group having 1 to 6 carbon atoms, and an aryl group having 6 to 15 carbon atoms. In addition, a part or all of hydrogen atoms of any one of the alkyl group, acyl group, and aryl group may be either substituted or not substituted. Examples of the alkyl group include a methyl group, an ethyl group, a n-propyl group, an i-propyl group, and a n-butyl group. Examples of the acyl group include an acetyl group. Examples of the aryl group include a phenyl group.

In the above formula (1), n represents an integer of 0 to 3. When n is 0, the compound is tetrafunctional silane; when n is 1, the compound is trifunctional silane; when n is 2, the compound is bifunctional silane, and when n is 3, the compound is monofunctional silane.

Examples of the hydrolyzable silane compound represented by the above formula (1) include tetrafunctional silane such as tetramethoxysilane, tetraethoxysilane, tetraacetoxysilane, and tetraphenoxysilane; trifunctional silane such as methyltrimethoxysilane, methyltriethoxysilane, methyltri-1-propoxysilane, methyltri-n-butoxysilane, ethyltrimethoxysilane, ethyltriethoxysilane, ethyltri-i-propoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-methacryloxypropyltrimethoxysilane, 3-methacryloxypropyltriethoxysilane, 3-acryloxypropyltrimethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)

ethyltrimethoxysilane, and 3-mercaptopropyltrimethoxysilane; bifunctional silane such as dimethyldimethoxysilane, dimethyldiethoxysilane, dimethyldiacetoxysilane, and di-n-butyldimethoxysilane, and diphenyldimethoxysilane; and monofunctional silane such as trimethylmethoxysilane, and tri-n-butylethoxysilane.

Among these hydrolyzable silane compounds, trifunctional silane and tetrafunctional silane may be preferably used in light of improvement of the surface hardness of the cured film.

The siloxane polymer (A) is preferably a hydrolysis-condensation product of (i) a compound represented by the above formula (1), wherein: $R^1$ is an aryl group having 6 to 15 carbon atoms; $R^2$ is any of a hydrogen atom, an alkyl group having 1 to 6 carbon atoms, and an acyl group having 1 to 6 carbon atoms; and n represents an integer of 1 to 3, and (ii) a compound represented by the above formula (1), wherein: $R^1$ is any one of a hydrogen atom, an alkyl group having 1 to 10 carbon atoms, and an alkenyl group having 2 to 10 carbon atoms; $R^2$ is any one of a hydrogen atom, an alkyl group having 1 to 6 carbon atoms, and an acyl group having 1 to 6 carbon atoms; and n represents an integer of 0 to 3. Use of the compound having such a specific structure enables the content of aryl groups relative to Si atoms to be easily controlled. By further using a compound selected from the group consisting of tetraethoxysilane (TEOS),2-(3,4-epoxycyclohexyl)ethyltrimethoxysilane, 3-glycidoxypropyltrimethoxysilane and 3-methacryloxypropyltrimethoxysilane as one component for forming the siloxane polymer as the component (A), in addition to effects achieved by making the percentage content of aryl groups fall within a specified range, an interlayer insulating film having a high surface hardness kept therewith can be obtained.

Conditions for permitting hydrolytic condensation of the hydrolyzable silane compound represented by the above formula (1) are not particularly limited as long as a condensation reaction can be caused by hydrolyzing at least a part of the hydrolyzable silane compound represented by the above formula (1) to convert the hydrolyzable groups ($-OR^2$) into silanol groups. According to exemplary conditions, the reaction may be carried out as in the following.

Water used in hydrolytic condensation of the hydrolyzable silane compound represented by the above formula (1) is preferably water purified by a method such as a reverse osmosis membrane treatment, an ion exchange treatment, or distillation. By using such purified water, side reactions can be suppressed, thereby capable of improving reactivity of the hydrolysis. The amount of water used is preferably 0.1 to 3 mol, more preferably 0.3 to 2 mol, and still more preferably 0.5 to 1.5 mol per mol of total amount of the hydrolyzable groups of the hydrolyzable silane compound represented by the above formula (1). Use of such an amount of water enables the reaction rate of the hydrolysis and condensation to be optimized.

Although the solvent which may be used in hydrolytic condensation of the hydrolyzable silane compound represented by the above formula (1) is not particularly limited, in general, a solvent similar to one used in preparation of the positive-type radiation-sensitive composition described later may be used. Examples of such solvents that are preferred include ethylene glycol monoalkyl ether acetate, diethylene glycol dialkyl ether, propylene glycol monoalkyl ether, propylene glycol monoalkyl ether acetate, and propionic acid esters. Among these solvents, diethylene glycol dimethyl ether, diethylene glycol ethylmethyl ether, propylene glycol monomethyl ether, propylene glycol monoethyl ether, propylene glycol monomethyl ether acetate or methyl 3-methoxypropionate, and 4-hydroxy-4-methyl-2-pentanone (diacetone alcohol) are particularly preferred.

The hydrolysis and condensation reaction of the hydrolyzable silane compound represented by the above formula (1) is carried out preferably in the presence of a catalyst such as an acid catalyst (for example, hydrochloric acid, sulfuric acid, nitric acid, formic acid, oxalic acid, acetic acid, trifluoroacetic acid, trifluoromethanesulfonic acid, phosphoric acid, an acidic ion exchange resin, or various Lewis acid), a base catalyst (for example, any of nitrogen-containing compounds such as ammonia, primary amines, secondary amines, tertiary amines and pyridine; a basic ion exchange resin; any of hydroxides such as sodium hydroxide; carbonate such as potassium carbonate; a carboxylic acid salt such as sodium acetate; or various Lewis base), or an alkoxide (for example, zirconium alkoxide, titanium alkoxide or aluminum alkoxide). For example, tri-1-propoxy aluminum may be used as the aluminum alkoxide. The amount of the catalyst used is preferably no greater than 0.2 mol, and more preferably 0.00001 to 0.1 mol per mol of the monomer of the hydrolyzable silane compound in light of acceleration of the hydrolytic condensation reaction.

The reaction temperature and the reaction time in the hydrolytic condensation of the hydrolyzable silane compound represented by the above formula (1) may be predetermined appropriately. For example, the following conditions may be employed. The reaction temperature is preferably 40 to 200° C., and more preferably 50 to 150° C. The reaction time is preferably 30 min to 24 hrs, and more preferably 1 to 12 hrs. The hydrolytic condensation reaction can be executed most efficiently by adopting such a range of the reaction temperature and reaction time. In this hydrolytic condensation, the hydrolyzable silane compound, water and the catalyst may be added into a reaction system to allow the reaction to proceed in a single step, or the hydrolyzable silane compound, water and the catalyst may be added into a reaction system after dividing into several aliquots to allow the hydrolytic condensation reaction to proceed in several steps. Further, after completing the hydrolytic condensation reaction, a dehydrating agent is added, and then the mixture is subjected to evaporation, thereby capable of eliminating water and produced alcohol from the reaction system. The dehydrating agent used in this step, in general, loses the dehydrating ability completely by adsorbing or including excess water, or is eliminated by evaporation; therefore, it is not involved in the category of the dehydrating agent as the component (E) described later, which is added to the positive-type radiation-sensitive composition.

The molecular weight of the hydrolysis-condensation product of the hydrolyzable silane compound represented by the above formula (1) may be measured in terms of the number average molecular weight of polystyrene using GPC (gel permeation chromatography) with tetrahydrofuran for a mobile phase. Here, the number average molecular weight of the hydrolysis-condensation product is generally in the range of preferably 500 to 10,000, and more preferably 1,000 to 5,000. By making the number average molecular weight of the hydrolysis-condensation product be no lower than 500, film formability of a coating film of the positive-type radiation-sensitive composition can be improved. On the other hand, by making the number average molecular weight of the hydrolysis-condensation product be no higher than 10,000, deterioration of radiation sensitivity of the positive-type radiation-sensitive composition can be prevented.

<Component (B): Quinone Diazide Compound>

The component (B) is a quinone diazide compound that generates carboxylic acid upon irradiation with a radiation.

The positive-type radiation-sensitive composition containing such a quinone diazide compound has a positive type radiation sensitive characteristic by which light-exposed portions in the radiation irradiation step are removed in the development step. The term "radiation" in referring to "radiation sensitive resin composition" herein indicates a concept involving visible light ray, ultra violet ray, far ultra violet ray, X-ray, charged particle beam, and the like.

For the quinone diazide compound as the component (B), a compound obtained by subjecting a compound having a phenolic hydroxyl group, and naphthoquinone diazide sulfonic acid halide to an esterification reaction may be preferably used. Examples of the compound having a phenolic hydroxyl group include those compounds in which ortho- and para-positions of the phenolic hydroxyl group are each independently either a hydrogen atom or a substituent represented by the following formula (2):

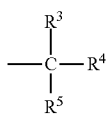

(2)

wherein, $R^3$, $R^4$ and $R^5$ each independently represent any one of an alkyl group having 1 to 10 carbon atoms, a carboxyl group, a phenyl group, and a substituted phenyl group; and at least two of $R^3$, $R^4$, $R^5$ may form a ring.

When $R^3$, $R^4$ and $R^5$ are an alkyl group having 1 to 10 carbon atoms in the substituent represented by the above formula (2), a part or all of hydrogen atoms of the alkyl group may be either substituted or not substituted. Examples of the alkyl group include a methyl group, an ethyl group, a n-propyl group, an i-propyl group, a n-butyl group, an i-butyl group, a t-butyl group, a n-hexyl group, a cyclohexyl group, a n-heptyl group, a n-octyl group, a trifluoromethyl group, and a 2-carboxyethyl group. Furthermore, the substituent of the substituted phenyl group may include a hydroxyl group. Moreover, examples of the cyclic group formed with $R^3$, $R^4$ and $R^5$ include a cyclopentane ring, a cyclohexane ring, an adamantane ring, and a fluorene ring.

Examples of the compound having a phenolic hydroxyl group include a group of compounds represented by the following formulae (3) and (4).

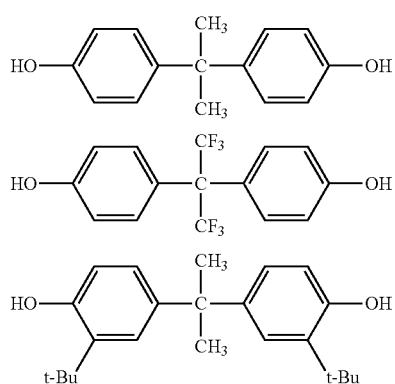

(3)

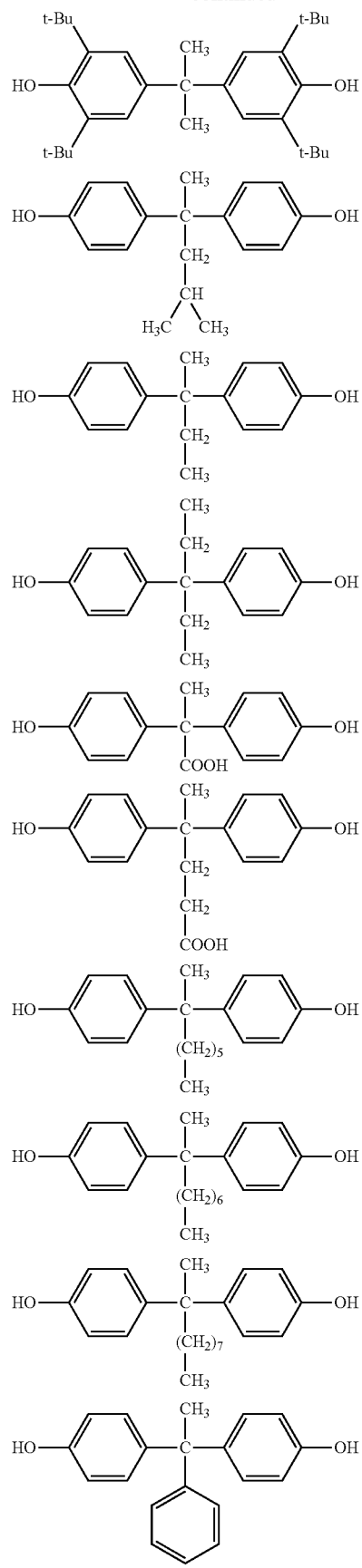

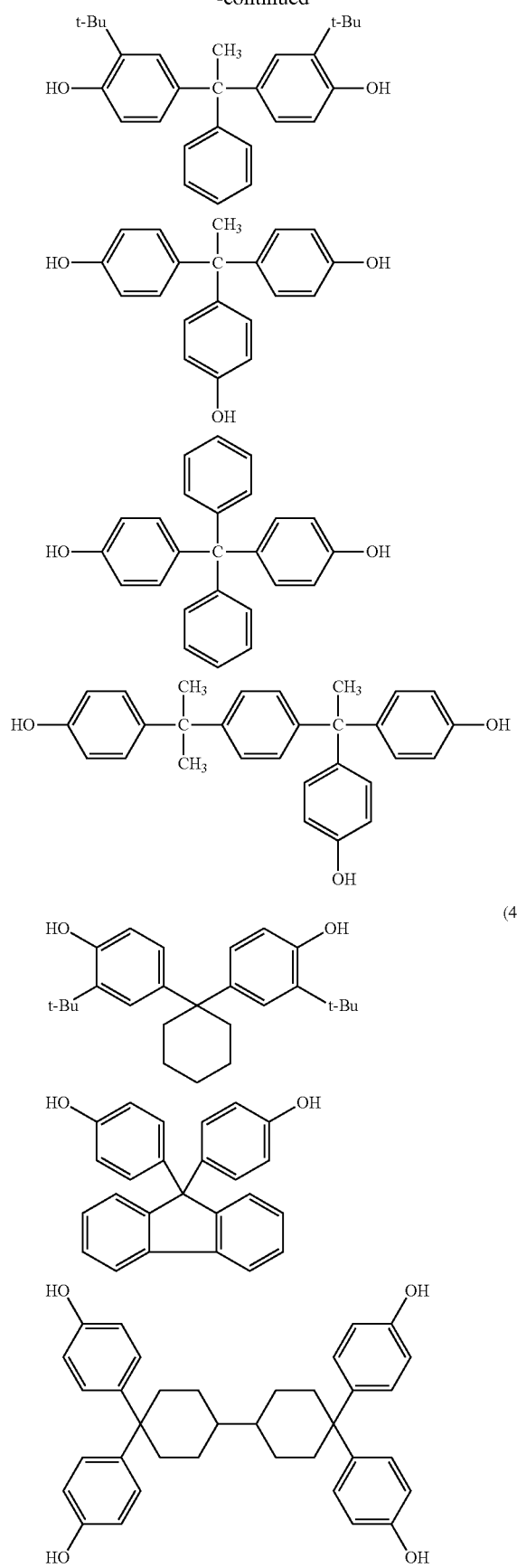
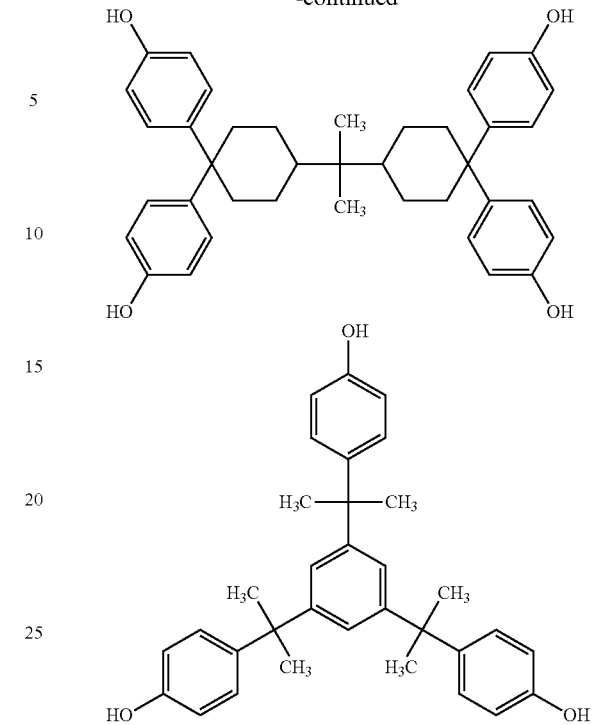

(4)

4-Naphthoquinone diazide sulfonic acid halide or 5-naphthoquinone diazide sulfonic acid halide may be used as the naphthoquinone diazide sulfonic acid halide. Since ester compounds (quinone diazide compounds) obtained from 4-naphthoquinone diazide sulfonic acid halide have absorption in an i-ray (wavelength: 365 nm) region, they are suited for exposure with i-ray. Furthermore, ester compounds (quinone diazide compounds) obtained from 5-naphthoquinone diazide sulfonic acid halide are suited for exposure at a wavelength in a wide range since absorption is found in a wavelength region in a wide range. To select either an ester compound obtained from 4-naphthoquinone diazide sulfonic acid halide, or an ester compound obtained from 5-naphthoquinone diazide sulfonic acid halide, depending on the wavelength employed in exposure is preferred. Examples of particularly preferable quinone diazide compound include condensates of 4,4'-[1-[4-[(1-(4-hydroxyphenyl)-1-methylethyl]phenyl]ethylidene]bisphenol (1.0 mol) and 1,2-naphthoquinone diazide-5-sulfonic acid chloride (3.0 mol), and condensates of 1,1,1-tri(p-hydroxyphenyl)ethane (1.0 mol) and 1,2-naphthoquinone diazide-5-sulfonic acid chloride (3.0 mol).

The quinone diazide compound has a molecular weight of preferably 300 to 1,500, and still more preferably 350 to 1,200. By making the molecular weight of the quinone diazide compound be no lower than 300, transparency of the formed interlayer insulating film can be kept at a high level. On the other hand, by making the molecular weight of the quinone diazide compound be no higher than 1,500, deterioration of pattern formability of the positive-type radiation-sensitive composition can be suppressed.

These quinone diazide compounds as the component (B) may be used alone, or two or more may be used in combination. The amount of the component (B) used in the positive-type radiation-sensitive composition is preferably 2 to 100 parts by mass, and more preferably 3 to 50 parts by mass relative to 100 parts by mass of the component (A). The amount of the component (B) of 2 to 100 parts by mass results in a large difference of solubility in an alkali aqueous solution used as a developing solution between the irradiated portion and the unirradiated portion with the radiation, whereby a favorable patterning performance is achieved.

<Component (C): Thermosensitive Acid Generator or Thermosensitive Base Generator>

The thermosensitive acid generator or thermosensitive base generator as the component (C) is defined as a compound capable of releasing an acidic active substance or a basic active substance that acts as a catalyst in allowing a condensation and curing reaction of the siloxane polymer as the component (A) (preferably, the hydrolysis-condensation product of a hydrolyzable silane compound represented by the above formula (1)) by heating. Use of such a compound as the component (C) enables the condensation reaction of the component (A) in the heating step after the development of the positive-type radiation-sensitive composition to be accelerated, whereby the interlayer insulating film that is superior in the surface hardness and heat resistance can be formed. Note that the thermosensitive acid generator or thermosensitive base generator as the component (C) preferably has a property of: avoiding release of the acidic active substance or the basic active substance during prebaking at a comparatively low temperature (e.g., 70 to 120° C.) in the coating film formation step of the positive-type radiation-sensitive composition; and capable of releasing the acidic active substance or the basic active substance during post-baking at a comparatively high temperature (e.g., 120 to 250° C.) in the heating step after the development.

The thermosensitive acid generator as the component (C) may include an ionic compound and/or a nonionic compound. It is preferred that the ionic compound does not contain a heavy metal, and a halogen ion. Examples of the ionic thermosensitive acid generator include methanesulfonic acid salts such as triphenylsulfonium, 1-dimethylthionaphthalene, 1-dimethylthio-4-hydroxynaphthalene, 1-dimethylthio-4,7-dihydroxynaphthalene, 4-hydroxyphenyldimethylsulfonium, benzyl-4-hydroxyphenylmethylsulfonium, 2-methylbenzyl-4-hydroxyphenylmethylsulfonium, 2-methylbenzyl-4-acetylphenylmethylsulfonium, and 2-methylbenzyl-4-benzoyloxyphenylmethylsulfonium; trifluoromethanesulfonic acid salts; camphorsulfonic acid salts; p-toluenesulfonic acid salt; hexafluorophosphoric acid salts; and the like. Furthermore, examples of commercially available products of benzylsulfonium salt include SI-60, SI-80, SI-100, SI-110, SI-145, SI-150, SI-80L, SI-100L, SI-110L, SI-145L, SI-150L, SI-160L, SI-180L (manufactured by Sanshin Chemical Industry Co., Ltd.), and the like.

Examples of nonionic thermosensitive acid generator include halogen-containing compounds, diazomethane compounds, sulfone compounds, sulfonic acid ester compounds, carboxylic acid ester compounds, phosphoric acid ester compounds, sulfonimide compounds, sulfone benzotriazole compounds, and the like.

Examples of the halogen-containing compound include haloalkyl group-containing hydrocarbon compounds, haloalkyl group-containing heterocyclic compounds, and the like. Examples of preferable halogen-containing compound include 1,1-bis(4-chlorophenyl)-2,2,2-trichloroethane, 2-phenyl-4,6-bis(trichloromethyl)-s-triazine, 2-naphthyl-4,6-bis(trichloromethyl)-s-triazine, and the like.

Examples of the diazomethane compound include bis(trifluoromethylsulfonyl)diazomethane, bis(cyclohexylsulfonyl)diazomethane, bis(phenylsulfonyl)diazomethane, bis(p-tolylsulfonyl)diazomethane, bis(2,4-xylylsulfonyl)diazomethane, bis(p-chlorophenylsulfonyl)diazomethane, methylsulfonyl-p-toluenesulfonyldiazomethane, cyclohexylsulfonyl(1,1-dimethylethylsulfonyl)diazomethane, bis(1,1-dimethylethylsulfonyl)diazomethane, phenylsulfonyl(benzoyl)diazomethane, and the like.

Examples of the sulfone compound include β-ketosulfone compounds, β-sulfonyl sulfone compounds, diaryldisulfone compounds, and the like. Examples of preferable sulfone compound include 4-trisphenacyl sulfone, mesitylphenacyl sulfone, bis(phenylsulfonyl)methane, 4-chlorophenyl-4-methylphenyl disulfone compounds, and the like.

Examples of the sulfonic acid ester compound include alkylsulfonic acid esters, haloalkyl sulfonic acid esters, arylsulfonic acid esters, imino sulfonate, and the like. Examples of preferable sulfonic acid ester compound include benzointosylate, pyrogalloltrimesylate, nitrobenzyl-9,10-diethoxyanthracene-2-sulfonate, 2,6-dinitrobenzylbenzenesulfonate, and the like. Examples of commercially available product of the imino sulfonate include PAI-101 (manufactured by Midori Kagaku Co., Ltd.), PAI-106 (manufactured by Midori Kagaku Co., Ltd.), CGI-1311 (manufactured by Ciba Specialty Chemicals plc.), and the like.

Examples of the carboxylic acid ester compound include carboxylic acid o-nitrobenzyl esters.

Examples of the sulfonimide compound include N-(trifluoromethylsulfonyloxy)succinimide (trade name "SI-105" (manufactured by Midori Kagaku Co., Ltd.)), N-(camphorsulfonyloxy) succinimide (trade name "SI-106" (manufactured by Midori Kagaku Co., Ltd.)), N-(4-methylphenylsulfonyloxy)succinimide (trade name "SI-101" (manufactured by Midori Kagaku Co., Ltd.)), N-(2-trifluoromethylphenylsulfonyloxy)succinimide, N-(4-fluorophenylsulfonyloxy)succinimide, N-(trifluoromethylsulfonyloxy)phthalimide, N-(camphorsulfonyloxy)phthalimide, N-(2-trifluoromethylphenylsulfonyloxy)phthalimide, N-(2-fluorophenylsulfonyloxy)phthalimide, N-(trifluoromethylsulfonyloxy)diphenylmaleimide (trade name "PI-105" (manufactured by Midori Kagaku Co., Ltd.)), N-(camphorsulfonyloxy) diphenylmaleimide, 4-methylphenylsulfonyloxy)diphenylmaleimide, N-(2-trifluoromethylphenylsulfonyloxy)diphenylmaleimide, N-(4-fluorophenylsulfonyloxy)diphenylmaleimide, N-(phenylsulfonyloxy)bicyclo[2.2.1]hept-5-ene-2,3-dicarboxylimide (trade name "NDI-100" (manufactured by Midori Kagaku Co., Ltd.)), N-(4-methylphenylsulfonyloxy) bicyclo[2.2.1]hept-5-ene-2,3-dicarboxylimide (trade name "NDI-101" (manufactured by Midori Kagaku Co., Ltd.)), N-(trifluoromethanesulfonyloxy)bicyclo[2.2.1]hept-5-ene-2,3-dicarboxylimide (trade name "NDI-105" (manufactured by Midori Kagaku Co., Ltd.)), N-(nonafluorobutanesulfonyloxy)bicyclo[2.2.1]hept-5-ene-2,3-dicarboxylimide (trade name "NDI-109" (manufactured by Midori Kagaku Co., Ltd.)), N-(camphorsulfonyloxy)bicyclo[2.2.1]hept-5-ene-2,3-dicarboxylimide (trade name "NDI-106" (manufactured by Midori Kagaku Co., Ltd.)), N-(camphorsulfonyloxy)-7-oxabicyclo[2.2.1]hept-5-ene-2,3-dicarboxylimide, N-(trifluoromethylsulfonyloxy)-7-oxabicyclo[2.2.1]hept-5-ene-2,3-dicarboxylimide, N-(4-methylphenylsulfonyloxy)bicyclo[2.2.1]hept-5-ene-2,3-dicarboxylimide, N-(4-methylphenylsulfonyloxy)-7-oxabicyclo[2.2.1]hept-5-ene-2,3-dicarboxylimide, N-(2-trifluoromethylphenylsulfonyloxy)bicyclo[2.2.1]hept-5-ene-2,3-dicarboxylimide, N-(2-trifluoromethylphenylsulfonyloxy)-7-oxabicyclo[2.2.1]hept-5-ene-2,3-dicarboxylimide, N-(4-fluorophenylsulfonyloxy)bicyclo[2.2.1]hept-5-ene-2,3-dicarboxylimide, N-(4-fluorophenylsulfonyloxy)-7-oxabicyclo[2.2.1]hept-5-ene-2,3-dicarboxylimide, N-(trifluoromethylsulfonyloxy)bicyclo[2.2.1]heptane-5,6- oxy-2,3-dicarboxylimide, N-(camphorsulfonyloxy)bicyclo[2.2.1]heptane-5,6-oxy-2,3-dicarboxylimide, N-(4-methylphenylsulfonyloxy)bicyclo[2.2.1]heptane-5,6-oxy-2,3-dicarboxylimide, N-(2-trifluoromethylphenylsulfonyloxy)bicyclo[2.2.1]heptane-5,6-oxy-2,3-dicarboxylimide, N-(4-fluorophenylsulfonyloxy)bicyclo[2.2.1]heptane-5,6-oxy-2,3-dicarboxylimide, N-(trifluoromethylsulfonyloxy)naphthyldicarboxylimide (trade name "NAI-105" (manufactured by Midori Kagaku Co., Ltd.)), N-(camphorsulfonyloxy) naphthyldicarboxylimide (trade Ltd.)), "NAI-106" (manufactured by Midori Kagaku Co., N-(4-methylphenylsulfonyloxy)naphthyldicarboxylimide (trade name "NAI-101" (manufactured by Midori Kagaku Co., N-(phenylsulfonyloxy)naphthyldicarboxylimide (trade name "NAI-100" (manufactured by Midori Kagaku Co., N-(2-trifluoromethylphenylsulfonyloxy)naphthyldicarboxylimide, N-(4-fluorophenylsulfonyloxy)naphthyldicarboxylimide, N-(pentafluoroethylsulfonyloxy)naphthyldicarboxylimide, N-(heptafluoropropylsulfonyloxy)naphthyldicarboxylimide, N-(nonafluorobutylsulfonyloxy)naphthyldicarboxylimide (trade name "NAI-109" (manufactured by Midori Kagaku Co., Ltd.)), N-(ethylsulfonyloxy)naphthyldicarboxylimide, N-(propylsulfonyloxy)naphthyldicarboxylimide, N-(butylsulfonyloxy)naphthyldicarboxylimide (trade name "NAI-1004" (manufactured by Midori Kagaku Co., Ltd.)), N-(pentylsulfonyloxy)naphthyldicarboxylimide, N-(hexylsulfonyloxy)naphthyldicarboxylimide, N-(heptylsulfonyloxy)naphthyldicarboxylimide, N-(octylsulfonyloxy)naphthyldicarboxylimide, N-(nonylsulfonyloxy) naphthyldicarboxylimide, and the like.

Other examples of the thermosensitive acid generator include tetrahydrothiophenium salts such as 1-(4-n-butoxynaphthalene-1-yl)tetrahydrothiophenium trifluoromethanesulfonate, and 1-(4,7-dibutoxy-1-naphthalenyl)tetrahydrothiophenium trifluoromethanesulfonate.

Examples of the thermosensitive base generator as the component (C) include complexes of a transition metal such as cobalt, orthonitrobenzyl carbamates, α,α-dimethyl-3,5-dimethoxybenzyl carbamates, acyloxyiminos, and the like.

Examples of the transition metal complex include bromopentaamminecobalt perchlorate, bromopentamethylaminecobalt perchlorate, bromopentapropylaminecobalt perchlorate, hexaamminecobalt perchlorate, hexamethylaminecobalt perchlorate, hexapropylaminecobalt perchlorate, and the like.

Examples of the orthonitrobenzyl carbamates include [[(2-nitrobenzyl)oxy]carbonyl]methylamine, [[(2-nitrobenzyl)oxy]carbonyl]propylamine, [[(2-nitrobenzyl)oxy]carbonyl]hexylamine, [[(2-nitrobenzyl)oxy]carbonyl]cyclohexylamine, [[(2-nitrobenzyl)oxy]carbonyl]aniline, [[(2-nitrobenzyl)oxy]carbonyl]piperidine, bis[[(2-nitrobenzyl)oxy]carbonyl]hexamethylenediamine, bis[[(2-nitrobenzyl)oxy]carbonyl]phenylenediamine, bis[[(2-nitrobenzyl)oxy]carbonyl]toluenediamine, bis[[(2-nitrobenzyl)oxy]carbonyl]diaminodiphenylmethane, bis[[(2-nitrobenzyl)oxy]carbonyl]piperazine, [[(2,6-dinitrobenzyl)oxy]carbonyl]methylamine, [[(2,6-dinitrobenzyl)oxy]carbonyl]propylamine, [[(2,6-dinitrobenzyl)oxy]carbonyl]hexylamine, [[(2,6-dinitrobenzyl)oxy]carbonyl]cyclohexylamine, [[(2,6-dinitrobenzyl)oxy]carbonyl]aniline, [[(2,6-dinitrobenzyl)oxy]carbonyl]piperidine, bis[[(2,6-dinitrobenzyl)oxy]carbonyl]hexamethylenediamine, bis[[(2,6-dinitrobenzyl)oxy]carbonyl]phenylenediamine, bis[[(2,6-dinitrobenzyl)oxy]carbonyl]toluenediamine, bis[[(2,6-dinitrobenzyl)oxy]carbonyl]diaminodiphenylmethane, bis[[(2,6-dinitrobenzyl)oxy]carbonyl]piperazine, and the like.

Examples of the α,α-dimethyl-3,5-dimethoxybenzyl carbamates include [[(α,α-dimethyl-3,5-dimethoxybenzyl)oxy]carbonyl]methylamine, [[(α, α-dimethyl-3,5-dimethoxybenzyl) oxy]carbonyl] propylamine, [[(α,α-dimethyl-3,5-dimethoxybenzyl)oxy]carbonyl] hexyl amine, [[(α,α-dimethyl-3,5-dimethoxybenzyl) oxy]carbonyl] cyclohexylamine, [[(α, α-dimethyl-3,5-dimethoxybenzyl) oxy]carbonyl] aniline, [[(α, α-dimethyl-3,5-dimethoxybenzyl) oxy]carbonyl] piperidine, bis[[(α, α-dimethyl-3,5-dimethoxybenzyl)oxy]carbonyl] hexamethylenediamine, bis [[(α, α-dimethyl-3,5-dimethoxybenzyl)oxy]carbonyl] phenylenediamine, bis[[(α, α-dimethyl-3,5-dimethoxybenzyl) oxy]carbonyl] toluenediamine, bis[[(α, α-dimethyl-3,5-dimethoxybenzyl) oxy]carbonyl] diaminodiphenylmethane, bis[[(α, α-dimethyl-3,5-dimethoxybenzyl)oxy]carbonyl] piperazine, and the like.

Examples of the acyloxyiminos include propionyl acetophenone oxime, propionyl benzophenone oxime, propionyl acetone oxime, butyryl acetophenone oxime, butyryl benzophenone oxime, butyryl acetone oxime, adipoyl acetophenone oxime, adipoyl benzophenone oxime, adipoyl acetone oxime, acroyl acetophenone oxime, acroyl benzophenone oxime, acroyl acetone oxime, and the like.

Examples of other thermosensitive base generator include 2-nitrobenzylcyclohexylcarbamate, and O-carbamoylhydroxyamide.

Among the thermosensitive acid generators and thermosensitive base generators illustrated hereinabove, benzyl-4-hydroxyphenylmethylsulfonium hexafluorophosphate, 2-nitrobenzylcyclohexylcarbamate, 1-(4,7-dibutoxy-1-naphthalenyl)tetrahydrothiophenium trifluoromethanesulfonate, and N-(trifluoromethylsulfonyloxy) naphthyldicarboxylimide are particularly preferred in light of the catalytic action of the condensation and curing reaction of the component (A).

Either acid or base is used from among the thermosensitive acid generator or the thermosensitive base generators as the component (C), and one type may be used alone, or two or more may be used as a mixture. The amount of the component (C) when used is preferably 0.1 parts by mass to 10 parts by mass, and more preferably 1 part by mass to 5 parts by mass relative to 100 parts by mass of the component (A). The amount of the component (C) used of 0.1 parts by mass to 10 parts by mass results in optimization of the radiation sensitivity of the positive-type radiation-sensitive composition, and formation of the interlayer insulating film having a high surface hardness is enabled while maintaining transparency.

<Component (D): Thermally Crosslinkable Compound>

The thermally crosslinkable compound as the component (D) acts as a crosslinking component of the siloxane polymer or the like as the component (A) during thermal curing in the heating step (post-baking step) when the interlayer insulating film is formed. By using such a compound as the component (D), condensation (crosslinking) of the component (A) in the heating step after development of the positive-type radiation-sensitive composition is further accelerated, whereby an interlayer insulating film having even more favorable surface hardness and heat resistance can be formed.

The thermally crosslinkable compound is not particularly limited as long as it is a compound that allows a siloxane polymer and the like to be crosslinked during thermal curing, and a compound having two or more reactive groups, for example, epoxy groups (oxylanyl group, oxetanyl group), vinyl groups, acryl groups, methacryl groups, methylol groups, alkoxymethyl groups, and silanol groups may be used. Among these compounds, a compound selected from the group consisting of compounds having two or more groups represented by the following formula (5), compounds represented by the following formula (6) compounds represented by the following formula (7), and a compound having two or more oxetane groups is preferably used. It should be noted that since the compound represented by the following formula (6) has a common structure with the silane compound represented by the above formula (1) that constitutes the siloxane polymer as the component (A), favorable compatibility with such a siloxane polymer is achieved, and whereby a cured film having high transparency can be obtained.

(5)

wherein, $R^6$ each independently represents a hydrogen atom or an alkyl group having 1 to 10 carbon atoms.

(6)

wherein, $R^7$ each independently represents any one of a hydrogen atom, an alkyl group having 1 to 10 carbon atoms, an alkenyl group having 2 to 10 carbon atoms, and an aryl group having 6 to 15 carbon atoms; $R^8$ each independently represents any one of a hydrogen atom, an alkyl group having 1 to 6 carbon atoms, an acyl group having 1 to 6 carbon atoms, and an aryl group having 6 to 15 carbon atoms; and m represents an integer of 0 to 2.

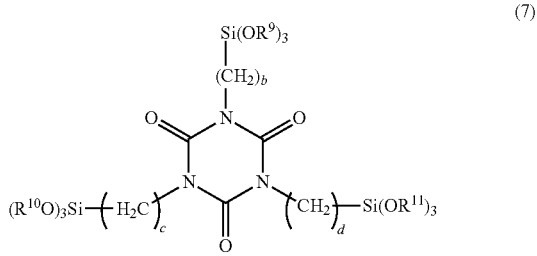
(7)

wherein, $R^9$, $R^{10}$ and $R^{11}$ each independently represent an alkyl group having 1 to 4 carbon atoms; and b, c and d each independently represent an integer of 1 to 6.

Examples of the alkyl group represented by $R^6$ in the group represented by the above formula (5) include a methyl group, an ethyl group, a n-propyl group, an i-propyl group, a n-butyl group, a t-butyl group, a n-hexyl group, a n-decyl group, and the like.

Examples of the compound having two or more groups represented by the above formula (5) include a group of the compounds represented by the formula (8) as in the following such as melamine derivatives, urea derivative, and phenolic compounds.

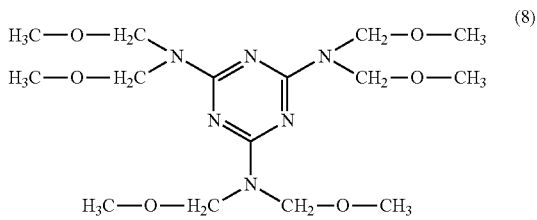
(8)

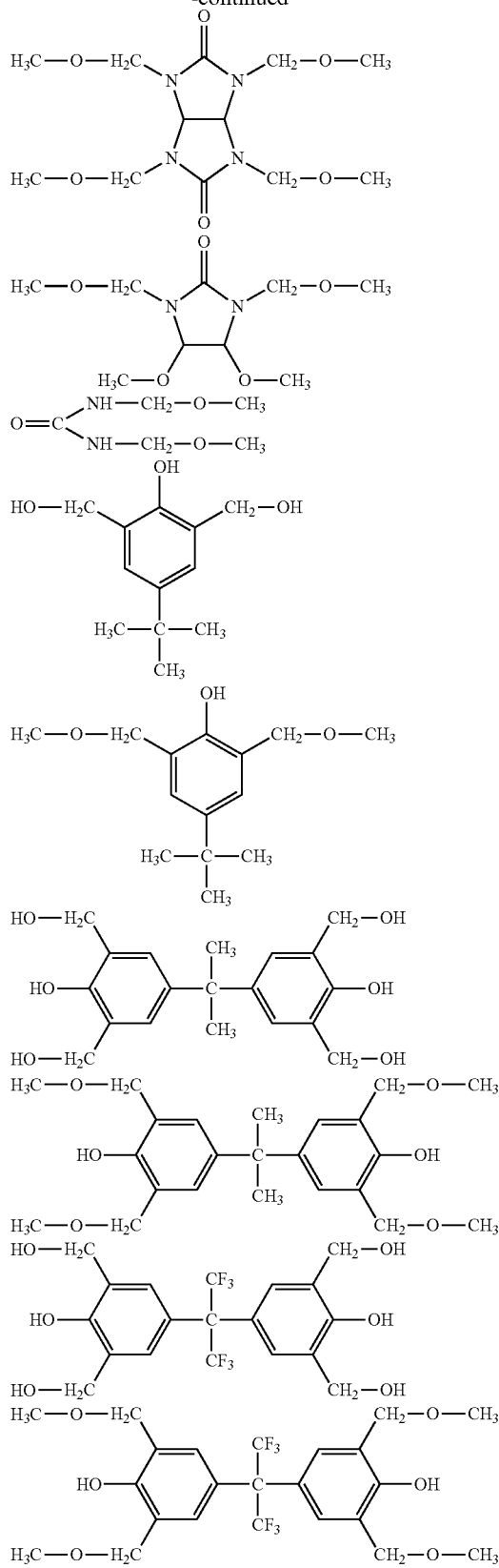

The compound having two or more groups represented by the above formula (5) not only improves the surface hardness and heat resistance of the cured film as a thermally crosslinkable compound, but also improves solubility of the component (A) in the positive-type radiation-sensitive composition, thereby consequently capable of leading to improvement of radiation sensitivity, and reduction of scum generated during the development. Among these compounds, 1,3,4,6-tetrakis (methoxymethyl)glycoluril (exemplary commercially available product being "Nikaluck MX-270" manufactured by SANWA Chemical Co., Ltd) is particularly preferably used since a significant effect of accelerating dissolution is achieved.

In the compound represented by the above formula (6), $R^7$ each independently represents any one of a hydrogen atom, an alkyl group having 1 to 10 carbon atoms, an alkenyl group having 2 to 10 carbon atoms, and an aryl group having 6 to 15 carbon atoms. A part or all of hydrogen atoms of any of the alkyl group, alkenyl group, and aryl group may be either substituted or not substituted. Examples of the alkyl group include a methyl group, an ethyl group, a n-propyl group, an i-propyl group, a n-butyl group, a t-butyl group, a n-hexyl group, a n-decyl group, a trifluoromethyl group, a 3,3,3-trifluoropropyl group, a 3-glycidoxypropyl group, a 2-(3,4-epoxycyclohexyl)ethyl group, a 3-aminopropyl group, a 3-mercaptopropyl group, a 3-isocyanatepropyl group, and the like. Examples of the alkenyl group include a vinyl group, a 3-acryloxypropyl group, a 3-methacryloxypropyl group, and the like. Examples of the aryl group include a phenyl group, a tolyl group, a p-hydroxyphenyl group, a 1-(p-hydroxyphenyl)ethyl group, a 2-(p-hydroxyphenyl)ethyl group, a 4-hydroxy-5-(p-hydroxyphenylcarbonyloxy)pentyl group, a naphthyl group, and the like.

$R^8$ in the above formula (6) each independently represents any one of a hydrogen atom, an alkyl group having 1 to 6 carbon atoms, an acyl group having 2 to 6 carbon atoms, an aryl group having 6 to 15 carbon atoms. A part or all of hydrogen atoms of any one of the alkyl group, acyl group, aryl group may be either substituted or not substituted. Examples of the alkyl group include a methyl group, an ethyl group, a n-propyl group, an i-propyl group, a n-butyl group, and the like. Examples of the acyl group include an acetyl group, and the like. Examples of the aryl group include a phenyl group, and the like.

Examples of the compound represented by the above formula (6) include tetramethoxysilane, tetraethoxysilane, tetraacetoxysilane, tetraphenoxysilane, methyltrimethoxysilane, methyltriethoxysilane, methyltri-1-propoxysilane, methyltri-n-butoxysilane, ethyltrimethoxysilane, ethyltriethoxysilane, ethyltri-1-propoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, vinyltrimethoxysilane, vinyltriethoxysilane, 3-acryloxypropyltrimethoxysilane, 3-acryloxypropyltriethoxysilane, 3-methacryloxypropyltrimethoxysilane, 3-methacryloxypropyltriethoxysilane, phenyltrimethoxysilane, phenyltriethoxysilane, p-hydroxyphenyltrimethoxysilane, 1-(p-hydroxyphenyl)ethyltrimethoxysilane, 2-(p-hydroxyphenyl)ethyltrimethoxysilane, 4-hydroxy-5-(p-hydroxyphenylcarbonyloxy)pentyltrimethoxysilane, trifluoromethyltrimethoxysilane, trifluoromethyltriethoxysilane, 3,3,3-trifluoropropyltrimethoxysilane, 3-aminopropyltrimethoxysilane, 3-aminopropyltriethoxysilane, 3-glycidoxypropyltrimethoxysilane, 3-glycidoxypropyltriethoxysilane, 2-(3,4-epoxycyclohexyl)ethyltrimethoxysilane, 3-mercaptopropyltrimethoxysilane, dimethyldimethoxysilane, dimethyldiethoxysilane, dimethyldiacetoxysilane, di-n-butyldimethoxysilane, diphenyldimethoxysilane, (3-glycidoxypropyl)methyldimethoxysilane, (3-glycidoxypropyl)methyldiethoxysilane, and the like.

In the compound represented by the above formula (7), $R^9$, $R^{10}$ and $R^{11}$ each independently represent an alkyl group having 1 to 4 carbon atoms. Examples of the alkyl group include a methyl group, an ethyl group, a propyl group, a butyl group, and the like. Moreover, b, c and d in the formula (3) is preferably an integer of 1 to 3 in light of the reactivity and compatibility with the component (A).

Examples of the compound represented by the above formula (7) include tris-(3-trimethoxysilylmethyl)isocyanurate, tris-(3-triethoxysilylmethyl)isocyanurate, tris-(3-trimethoxysilylethyl)isocyanurate, tris-(3-triethoxysilylethyl)isocyanurate, tris-(3-trimethoxysilylpropyl)isocyanurate, tris-(3-triethoxysilylpropyl)isocyanurate, and the like.

Examples of the compound having two or more oxetane groups include, as commercially available products, OXT-121, OXT-221, OXT-191, OX-SQ-H, PNOX-1009 and RSOX (manufactured by Toagosei Chemical Industry Co., Ltd.), and ETERNACOLL® OXBP and ETERNACOLL® OXTP (manufactured by Ube Industries, Ltd.).

Among these thermally crosslinkable compounds as the component (D), N,N,N,N-tetra(methoxymethyl)glycoluril, 3-glycidoxypropyltrimethoxysilane, and tris-(3-trimethoxysilylpropyl)isocyanurate are particularly preferred in light of improvement of the surface hardness and heat resistance of the formed interlayer insulating film.

The thermally crosslinkable compound as the component (D) may be used either alone, or two or more may be used as a mixture. The amount of the component (D) when used is preferably 0.1 parts by mass to 20 parts by mass, and more preferably 1 part by mass to 10 parts by mass relative to 100 parts by mass of the component (A). The amount of the component (D) used of 0.1 parts by mass to 20 parts by mass further improves radiation sensitivity of the positive-type radiation-sensitive composition, and thus an interlayer insulating film having a high surface hardness can be formed while preventing reduction of the transparency.

<Other Optional Component>

The positive-type radiation-sensitive composition of the present invention may contain in addition to the component (A) and the component (B), and the component (C) and the component (D) as suitable optional components described above, also (E) a dehydrating agent, (F) a surface active agent and the like as other optional component as needed in the range not to deteriorate the desired effects.

The dehydrating agent as the component (E) is defined as a substance capable of converting water into a substance other than water by a chemical reaction, or capable of trapping water by physical adsorption or inclusion. By optionally containing the dehydrating agent (E) in the positive-type radiation-sensitive composition, the moisture that intrudes from the environment, or the moisture that is generated as a result of condensation of the component (A) in the heating step after the development of the positive-type radiation-sensitive composition can be reduced. Therefore, use of the dehydrating agent (E) enables the moisture in the composition to be reduced, and as a result, the storage stability of the composition can be improved. Furthermore, it is believed that reactivity of the condensation of the component (A) can be enhanced. As such a dehydrating agent (E), at least one compound selected from the group consisting of carboxylic acid ester, acetals (including ketals), and carboxylic anhydride may be preferably used.

Examples of preferable carboxylic acid ester include orthocarboxylic acid esters, silyl carboxylic acid esters, and the like. Specific examples of the orthocarboxylic acid ester include methyl orthoformate, ethyl orthoformate, propyl orthoformate, butyl orthoformate, methyl orthoacetate, ethyl orthoacetate, propyl orthoacetate, butyl orthoacetate, methyl orthopropionate, ethyl orthopropionate, and the like. Furthermore, among these orthocarboxylic acid esters, orthoformic acid esters such as methyl orthoformate are particularly preferred. Specific examples of the silyl carboxylic acid ester include trimethylsilyl acetate, tributylsilyl acetate, trimethylsilyl formate, trimethylsilyl oxalate, and the like.

Examples of preferable acetals include reaction products of a ketone and an alcohol, reaction products of a ketone and a dialcohol, and ketene silyl acetals. Specific examples of the reaction product of a ketone and an alcohol include dimethyl acetal, diethyl acetal, dipropyl acetal, and the like.

Examples of preferable carboxylic anhydride include formic anhydride, acetic anhydride, succinic anhydride, maleic anhydride, phthalic anhydride, benzoic anhydride, acetic benzoic anhydride, and the like. Among these carboxylic anhydrides, acetic anhydride and succinic anhydride are preferred in light of dehydrating effects.

The amount of the dehydrating agent (E) when used is preferably 0.1 to 50 parts by mass, still more preferably 0.5 to 30 parts by mass, and particularly preferably 1 to 10 parts by mass relative to 100 parts by mass of the component (A). The amount of the dehydrating agent (E) used of 0.1 to 50 parts by mass enables the storage stability of the positive-type radiation-sensitive composition to be optimized.

The surface active agent as the component (F) may be added for the purpose of improving coating properties of the positive-type radiation-sensitive composition, decreasing unevenness of the coating, and improving the developability of the irradiated portion with the radiation. Examples of preferable surface active agent include nonionic surface active agents, fluorochemical surfactants, and silicone-based surface active agents.

Examples of the nonionic surface active agent include polyoxyethylene alkyl ethers such as polyoxyethylene lauryl ether, polyoxyethylene stearyl ether, and polyoxyethylene oleyl ether; polyoxyethylene aryl ethers such as polyoxyethylene octylphenyl ether, and polyoxyethylene nonylphenyl ether; polyethylene glycol dialkyl esters such as polyethylene glycol dilaurate, and polyethylene glycol distearate; (meth)acrylic acid-based copolymers, and the like. Examples of the (meth)acrylic acid-based copolymers include commercially available Polyflow No. 57 and No. 95 (trade name, manufactured by Kyoeisha Chemical Co., Ltd.), and the like.

Examples of the fluorochemical surfactant include fluoroethers such as 1,1,2,2-tetrafluorooctyl (1,1,2,2-tetrafluoropropyl)ether, 1,1,2,2-tetrafluorooctylhexyl ether, octaethylene glycol di(1,1,2,2-tetrafluorobutyl)ether, hexaethylene glycol (1,1,2,2,3,3-hexafluoropentyl)ether, octapropylene glycol di(1,1,2,2-tetrafluorobutyl)ether, and hexapropylene glycol di(1,1,2,2,3,3-hexafluoropentyl)ether; sodium perfluorododecylsulfonate; fluoroalkanes such as 1,1,2,2,8,8,9,9,10,10-decafluorododecane, and 1,1,2,2,3,3-hexafluorodecane; sodium fluoroalkylbenzenesulfonates; fluoroalkyloxyethylene ethers; fluoroalkylammonium iodides; fluoroalkyl polyoxyethylene ethers; perfluoroalkyl polyoxyethanols; perfluoroalkyl alkoxylates; fluorine-based alkyl esters, and the like.

Examples of commercially available products of these fluorochemical surfactants include EFTOP EF301, 303, 352 (manufactured by Shin Akita Kasei Co., Ltd.), MEGAFAC F171, 172 and 173 (manufactured by Dainippon Ink and Chemicals, Incorporated), Fluorad™ FC430, 431 (manufactured by Sumitomo 3M Ltd.), AashiGuard AG710, Surflon S-382, SC-101, 102, 103, 104, 105, 106 (manufactured by Asahi Glass Co., Ltd.), FTX-218 (manufactured by NEOS Co., Ltd.), and the like.

Examples of the silicone-based surface active agent which are commercially available include trade names, SH200-100cs, SH28PA, SH30PA, ST89PA, SH190, SH8400 FLUID (manufactured by Dow Corning Toray Silicone Co., Ltd.), Organosiloxane polymer KP341 (manufactured by Shin-Etsu Chemical Co., Ltd.), and the like.

The amount of the surface active agent (F) when used is preferably 0.01 to 10 parts by mass, and more preferably 0.05 to 5 parts by mass relative to 100 parts by mass of the component (A). The amount of the surface active agent (F) used of 0.01 to 10 parts by mass enables the coating property of the positive-type radiation-sensitive composition to be optimized.

<Positive-Type Radiation-Sensitive Composition>

The positive-type radiation-sensitive composition of the present invention is prepared by mixing the siloxane polymer as the component (A) and the quinone diazide compound as the component (B) described above, and the optional component (the thermosensitive acid generator or thermosensitive base generator as the component (C), the thermally crosslinkable compound as the component (D), etc.). In general, the positive-type radiation-sensitive composition is prepared and used preferably in a state dissolved or dispersed in a suitable solvent. For example, the positive-type radiation-sensitive composition in a state of a solution or dispersion liquid can be formed by mixing the components (A) and (B), and the optional component in a solvent at a certain ratio.

The solvent which may be suitably used in preparation of the positive-type radiation-sensitive composition dissolves or disperses each component homogenously, and does not react with each component. The solvent may include for example, ethers, diethylene glycol alkyl ethers, ethylene glycol alkyl ether acetates, propylene glycol monoalkyl ethers, propylene glycol monoalkyl ether acetates, propylene glycol monoalkyl ether propionates, aromatic hydrocarbons, ketones, esters, and the like.

Examples of the solvent include:

ethers such as e.g., tetrahydrofuran, etc.;

diethylene glycol alkyl ethers such as e.g., diethylene glycol monomethyl ether, diethylene glycol monoethyl ether, diethylene glycol dimethyl ether, diethylene glycol diethyl ether, diethylene glycol ethylmethyl ether, etc.;

ethylene glycol alkyl ether acetates such as e.g., methylcellosolve acetate, ethylcellosolve acetate, ethylene glycol monobutyl ether acetate, ethylene glycol monoethyl ether acetate, etc.;

propylene glycol monoalkyl ethers such as e.g., propylene glycol monomethyl ether, propylene glycol monoethyl ether, propylene glycol monopropyl ether, propylene glycol monobutyl ether, etc.;

propylene glycol monoalkyl ether acetates such as e.g., propylene glycol monomethyl ether acetate, propylene glycol monoethyl ether acetate, propylene glycol monopropyl ether acetate, propylene glycol monobutyl ether acetate, etc.;

propylene glycol monoalkyl ether propionates such as e.g., propylene glycol monomethyl ether propionate, propylene glycol monoethyl ether propionate, propylene glycol monopropyl ether propionate, propylene glycol monobutyl ether propionate, etc.;

aromatic hydrocarbons such as e.g., toluene, xylene, etc.;

ketones such as e.g., methyl ethyl ketone, methyl i-butyl ketone, cyclohexanone, 2-heptanone, 4-hydroxy-4-methyl-2-pentanone (diacetone alcohol), etc.;

esters such as e.g., methyl acetate, ethyl acetate, propyl acetate, i-propyl acetate, butyl acetate, ethyl 2-hydroxypropionate, methyl 2-hydroxy-2-methylpropionate, ethyl 2-hydroxy-2-methylpropionate, methyl hydroxyacetate, ethyl hydroxyacetate, butyl hydroxyacetate, methyl lactate, ethyl lactate, propyl lactate, butyl lactate, methyl 3-hydroxypropionate, ethyl 3-hydroxypropionate, propyl 3-hydroxypropionate, butyl 3-hydroxypropionate, methyl 2-hydroxy-3-methylbutanoate, methyl methoxyacetate, methoxyethyl acetate, propyl methoxyacetate, butyl methoxyacetate, methyl ethoxyacetate, ethyl ethoxyacetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionate, ethyl 2-methoxypropionate, propyl 2-methoxypropionate, butyl 2-methoxypropionate, methyl 2-ethoxypropionate, ethyl 2-ethoxypropionate, etc., respectively.

Among these solvents, in light of having superior solubility or dispersibility, being nonreactive with each component, and ease in formation of the coating film, diethylene glycol alkyl ethers, ethylene glycol alkyl ether acetates, propylene glycol monoalkyl ethers, propylene glycol monoalkyl ether acetates, ketones and esters are preferred, and diethylene glycol diethyl ether, diethylene glycol ethylmethyl ether, methylcellosolve acetate, ethylcellosolve acetate, propylene glycol monomethyl ether, propylene glycol monoethyl ether, propylene glycol monomethyl ether acetate, propylene glycol monoethyl ether acetate, cyclohexanone, propyl acetate, i-propyl acetate, butyl acetate, ethyl 2-hydroxypropionate, methyl 2-hydroxy-2-methylpropionate, ethyl 2-hydroxy-2-methylpropionate, methyl lactate, ethyl lactate, propyl lactate, butyl lactate, methyl 2-methoxypropionate, and ethyl 2-methoxypropionate are particularly preferred. These solvents may be used alone, or as a mixture.

In addition to the aforementioned solvent, high boiling point solvent such as benzylethyl ether, dihexyl ether, diethylene glycol monomethyl ether, diethylene glycol monoethyl ether, diethylene glycol monobutyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenylcellosolve acetate, or carbitol acetate may also be further used in combination as needed.

When the positive-type radiation-sensitive composition is prepared in a state of a solution or dispersion liquid, the ratio of the components other than the solvent to be included in the liquid (i.e., total amount of the components (A) and (B), and the optional components) may be optionally predetermined depending on intended use, desired film thickness and the like, but the ration is preferably 5 to 50% by mass, more preferably 10 to 40% by mass, and still more preferably 15 to 35% by mass.

<Formation of Interlayer Insulating Film>

The positive-type radiation-sensitive composition of the present invention is suitably used for forming a cured film. A method of forming a cured film such as an interlayer insulating film on a substrate using the positive-type radiation-sensitive composition described above is explained below. The method includes the following steps in this order:

(1) forming a coating film of the positive-type radiation-sensitive composition of the present invention on a substrate;

(2) irradiating at least a part of the coating film formed in the step (1) with a radiation, (3) developing the coating film irradiated with a radiation in the step (2); and (4) heating the coating film developed in the step (3).

(1) Step of Forming Coating Film of Positive-Type Radiation-Sensitive Composition on Substrate In the step (1) described above, after the positive-type radiation-sensitive composition of the present invention is applied on a substrate, preferably the solvent is removed by heating (prebaking) the applied face to form a coating film. Examples of the substrate material which may be used include glass, quartz, silicon, resin, and the like. Specific examples of the resin include polyethylene terephthalate, polybutylene terephthalate, polyethersulfone, polycarbonate, polyimide, ring-opened polymers of cyclic olefin, and hydrogenated products thereof, and the like.

Application method of the positive-type radiation-sensitive composition of the present invention is not particularly limited, and for example, any appropriate method such as a spray coating method, a roll coating method, a spin coating method, a slid die coating method, a bar coating method, or the like may be employed. Among these application methods, a spin coating method or a slit die coating method is particularly preferred. Conditions of the prebaking may vary depending on the type of each component, and blend ratio, etc., the prebaking may be carried out preferably at 70 to 120° C. for about 1 to 10 min.

(2) Step of Irradiating at Least a Part of the Coating Film with Radiation

In the step (2) described above, at least a part of the formed coating film is subjected to exposure. In this case, when a part of the coating film is exposed, the exposure is generally carried out through a photomask having a predetermined pattern. The radiation which may be used for the exposure includes, for example, visible light ray, ultra violet ray, far ultra violet ray, electron beam, X-ray or the like. Among these radiation, radiation having a wavelength in the range of 190 to 450 nm are preferred, and a radiation involving an ultra violet ray having a wavelength of 365 nm is particularly preferred.

The light exposure in this step is preferably 100 to 10,000 $J/m^2$, and more preferably 300 to 6,000 $J/m^2$ as a measurement of the intensity of the radiation at a wavelength of 365 nm using an illuminance meter (OAI model 356, manufactured by OAI Optical Associates Inc.).

(3) Development Step

In the step (3) described above, unnecessary portions (irradiated portion with the radiation) are removed by developing the exposed coating film to form the predetermined pattern. A developing solution used in the development step is preferably an aqueous solution of an alkali (basic compound). Examples of the alkali include inorganic alkalis such as sodium hydroxide, potassium hydroxide, sodium carbonate, sodium silicate, sodium metasilicate and ammonia; quaternary ammonium salts such as tetramethylammoniumhydroxide (TMAH) and tetraethylammoniumhydroxide, and the like.

In addition, such an alkali aqueous solution may be used after adding a water soluble organic solvent such as methanol or ethanol, and/or a surface active agent thereto in an appropriate amount. The concentration of the alkali in the alkali aqueous solution is preferably no less than 0.1% by mass and no greater than 5% by mass in view of adequate developability enabled to be achieved. As the development method, for example, any appropriate method such as a puddle method, a dipping method, a shaking immersion method, or a showering method may be employed. The development time period may vary depending on the composition of the positive-type radiation-sensitive composition, and is preferably about 10 to 180 sec. Subsequent to such a development treatment, for example, washing with running water is carried out for 30 to 90 sec, followed by, for example, air-drying with compressed air or compressed nitrogen, whereby a desired pattern can be formed.

(4) Heating Step In the step (4) described above, the patterned thin film is heated using a heating apparatus such as a hot plate or an oven to accelerate the condensation reaction of the aforementioned component (A), whereby a cured matter can be obtained. Particularly, when the thermosensitive acid generator or thermosensitive base generator as the component (C) is used, an acidic active substance or a basic active substance is generated in the heating step, which substance is believed to further accelerate the condensation reaction of the component (A) by serving as a catalyst. The heating temperature in this step is, for example, 120 to 250° C. The heating time period may vary depending on the type of the heating device, and when the heating step is carried out for example, on a hot plate, the heating time period may be 5 to 30 min, whereas when the heating step is carried out in an oven, the heating time may be 30 to 90 min. A step baking method or the like in which the heating step is carried out two or more times may be also employed. Accordingly, a patterned thin film corresponding to the intended interlayer insulating film can be formed on the surface of the substrate.

<Interlayer Insulating Film>

Thus formed interlayer insulating film has a film thickness of preferably 0.1 to 8 µm, more preferably 0.1 to 6 µm, and still more preferably 0.1 to 4 µm.

The interlayer insulating film formed from the positive-type radiation-sensitive composition of the present invention does, as is also demonstrated clearly by the Examples below, satisfy generally demanded characteristics, i.e., heat resistance, transparency and low dielectricity in a well balanced manner, and exhibits a superior refractive index, resist remover solution resistance in ITO film etching steps, and dry etching resistance. In addition, the interlayer insulating film enables a liquid crystal panel having a high voltage holding ratio to be formed. Therefore, this interlayer insulating film is suitably used for a display device.

<Display Device>

The display device of the present invention is provided with an interlayer insulating film formed from the positive-type radiation-sensitive composition. Thus, general characteristics expected in terms of practical applications as a display device are satisfied. In the display device, two substrates having a liquid crystal alignment film formed on the surface thereof are placed oppositely on the side of the liquid crystal alignment film, via a sealing agent provided at peripheral part of the substrate, and a liquid crystal is filled between these two substrates.

<Siloxane Polymer>

A cured film obtained using the siloxane polymer of the present invention which has the content of the aryl groups relative to the Si atoms having greater than 60% by mole and no greater than 95% by mole is suitably used for forming interlayer insulating films due to having superior mechanical and electrical characteristics.

EXAMPLES

Hereinafter, the present invention is explained in more detail by way of referring to Synthesis Examples and Examples, but the present invention is not limited to the following Examples.

The number average molecular weight (Mn) and the weight average molecular weight (Mw) of the hydrolysis-condensation product of the hydrolyzable silane compound obtained in the following each Synthesis Example were measured by gel permeation chromatography (GPC) under the following conditions.

Apparatus: GPC-101 (manufactured by Showa Denko K.K.)

Column: GPC-KF-801, GPC-KF-802, GPC-KF-803 and GPC-KF-804 (manufactured by Showa Denko K.K.) serially linked Mobile phase: tetrahydrofuran Synthesis Examples of Hydrolysis-Condensation Product of Hydrolyzable Silane Compound of Component (A)

Synthesis Example 1

In a vessel equipped with a stirrer was charged 161.4 g of propylene glycol monomethyl ether, and subsequently 128.9 g of phenyltrimethoxysilane (0.65 mol), 72.9 g of tetraethoxysilane (0.35 mol) and 0.8 g of tri-1-propoxy aluminum were charged thereto. The mixture was heated until the solution temperature became 60° C. After the solution temperature reached 60° C., 54 g of ion exchanged water was charged, and the mixture was heated up to 75° C. and kept for 3 hrs. Next, 159 g of methyl orthoformate as a dehydrating agent was added, and the mixture was stirred for 1 hour. Then, the solution temperature was lowered to 40° C., and evaporation was executed while keeping the temperature to eliminate ion exchanged water and methanol generated by hydrolytic condensation. Accordingly, a hydrolysis-condensation product (A-1) was obtained. The solid content concentration of the hydrolysis-condensation product (A-1) was 40.3% by mass, and the number average molecular weight (Mn) of the obtained hydrolysis-condensation product was 1,500, with a molecular weight distribution (Mw/Mn) of 2. In addition, the content of the aryl groups (phenyl groups) relative to Si atoms in the hydrolysis-condensation product (A-1) was 65% by mole.

Synthesis Example 2

In a vessel equipped with a stirrer was charged 139.4 g of diacetone alcohol, and subsequently 128.9 g of phenyltrimethoxysilane (0.65 mol) and 47.7 g of methyltrimethoxysilane (0.35 mol) were charged thereto. The mixture was stirred at room temperature. Next, an oxalic acid aqueous solution prepared by dissolving 0.18 g of oxalic acid in 54 g of ion exchanged water was added dropwise thereto, and heated until the solution temperature became 75° C. After the solution temperature reached 75° C., the mixture was kept for 3 hrs. Next, 159 g of methyl orthoformate as a dehydrating agent was added, and the mixture was stirred for 1 hour. Then, the solution temperature was lowered to 40° C., and evaporation was executed while keeping the temperature to eliminate ion exchanged water and methanol generated by hydrolytic condensation. Accordingly, a hydrolysis-condensation product (A-2) was obtained. The solid content concentration of the hydrolysis-condensation product (A-2) was 40.5% by mass, and the number average molecular weight (Mn) of the obtained hydrolysis-condensation product was 1,600, with a molecular weight distribution (Mw/Mn) of 2. In addition, the content of the aryl groups (phenyl groups) relative to Si atoms in the hydrolysis-condensation product (A-2) was 65% by mole.

Synthesis Example 3

In a vessel equipped with a stirrer was charged 139.4 g of diacetone alcohol, and subsequently 128.9 g of phenyltrimethoxysilane (0.65 mol) and 47.7 g of methyltrimethoxysilane (0.35 mol) were charged thereto. The mixture was stirred at room temperature. Next, an phosphoric acid aqueous solution prepared by dissolving 0.18 g of phosphoric acid in 54 g of ion exchanged water was added dropwise thereto, and heated until the solution temperature became 75° C. After the solution temperature reached 75° C., the mixture was kept for 3 hrs. Next, 159 g of methyl orthoformate as a dehydrating agent was added, and the mixture was stirred for 1 hour. Then, the solution temperature was lowered to 40° C., and evaporation was executed while keeping the temperature to eliminate ion exchanged water and methanol generated by hydrolytic condensation. Accordingly, a hydrolysis-condensation product (A-3) was obtained. The solid content concentration of the hydrolysis-condensation product (A-3) was 40.5% by mass, and the number average molecular weight (Mn) of the obtained hydrolysis-condensation product was 1,700, with a molecular weight distribution (Mw/Mn) of 2. In addition, the content of the aryl groups (phenyl groups) relative to Si atoms in the hydrolysis-condensation product (A-3) was 65% by mole.

Synthesis Example 4

In a vessel equipped with a stirrer was charged 139.4 g of diacetone alcohol, and subsequently 128.9 g of phenyltrimethoxysilane (0.65 mol) and 47.7 g of methyltrimethoxysilane (0.35 mol) were charged thereto. The mixture was stirred at room temperature, and then an phosphoric acid aqueous solution prepared by dissolving 0.18 g of phosphoric acid in 54 g of ion exchanged water was added dropwise thereto. The mixture was heated until the solution temperature became 40° C., further heated until the solution temperature became 100° C. over 1 hour, and then stirred while heating to keep this temperature for 2 hrs. Thereafter, the solution temperature was lowered to 40° C., and evaporation was executed while keeping the temperature to eliminate ion exchanged water and methanol generated by hydrolytic condensation. Accordingly, a hydrolysis-condensation product (A-4) was obtained. The solid content concentration of the hydrolysis-condensation product (A-4) was 40.5% by mass, and the number average molecular weight (Mn) of the obtained hydrolysis-condensation product was 2,000, with a molecular weight distribution (Mw/Mn) of 2. In addition, the content of the aryl groups (phenyl groups) relative to Si atoms in the hydrolysis-condensation product (A-4) was 65% by mole.

Synthesis Example 5

In a vessel equipped with a stirrer was charged 139.4 g of diacetone alcohol, and subsequently 138.8 g of phenyltrimethoxysilane (0.70 mol), 20.4 g of methyltrimethoxysilane (0.15 mol) and 31.2 g of tetraethoxysilane (0.15 mol) were charged thereto. The mixture was stirred at room temperature, and then an phosphoric acid aqueous solution prepared by dissolving 0.18 g of phosphoric acid in 54 g of ion exchanged water was added dropwise thereto. The mixture was heated until the solution temperature became 40° C., further heated until the solution temperature became 100° C. over 1 hour, and then stirred while heating to keep this temperature for 2 hrs. Thereafter, the solution temperature was lowered to 40° C., and evaporation was executed while keeping the temperature to eliminate ion exchanged water and methanol generated by hydrolytic condensation. Accordingly, a hydrolysis-condensation product (A-5) was obtained. The solid content concentration of the hydrolysis-condensation product (A-5) was 40.1% by mass, and the number average molecular weight (Mn) of the obtained hydrolysis-condensation product was 1,800, with a molecular weight distribution (Mw/Mn) of 2. In addition, the content of the aryl groups (phenyl groups) relative to Si atoms in the hydrolysis-condensation product (A-5) was 70% by mole.

Synthesis Example 6

In a vessel equipped with a stirrer was charged 139.4 g of diacetone alcohol, and subsequently 188.4 g of phenyltrimethoxysilane (0.95 mol) and 10.4 g of tetraethoxysilane (0.05 mol) were charged thereto. The mixture was stirred at room temperature, and then a phosphoric acid aqueous solution prepared by dissolving 0.18 g of phosphoric acid in 54 g of ion exchanged water was added dropwise thereto. The mixture was heated until the solution temperature became 40° C., further heated until the solution temperature in the vessel became 100° C. over 1 hour, and then stirred while heating to keep this temperature for 2 hrs. Thereafter, the solution temperature was lowered to 40° C., and evaporation was executed while keeping the temperature to eliminate ion exchanged water and methanol generated by hydrolytic condensation. Accordingly, a hydrolysis-condensation product (A-6) was obtained. The solid content concentration of the hydrolysis-condensation product (A-6) was 40.5% by mass, and the number average molecular weight (Mn) of the obtained hydrolysis-condensation product was 1,400, with a molecular weight distribution (Mw/Mn) of 2. In addition, the content of the aryl groups (phenyl groups) relative to Si atoms in the hydrolysis-condensation product (A-6) was 95% by mole.

Synthesis Example 7

In a vessel equipped with a stirrer was charged 139.4 g of diacetone alcohol, and subsequently 128.9 g of phenyltrimethoxysilane (0.65 mol), 34.1 g of methyltrimethoxysilane (0.25 mol) and 24.6 g of 2-(3,4-epoxycyclohexyl)ethyltrimethoxysilane (manufactured by Shin-Etsu Chemical Co., Ltd., "KBM-303") (0.1 mol) were charged thereto. The mixture was stirred at room temperature, and then a phosphoric acid aqueous solution prepared by dissolving 0.18 g of phosphoric acid in 54 g of ion exchanged water was added dropwise thereto. The mixture was heated until the solution temperature became 40° C., further heated until the solution temperature became 100° C. over 1 hour, and then stirred while heating to keep this temperature for 2 hrs. Thereafter, the solution temperature was lowered to 40° C., and evaporation was executed while keeping the temperature to eliminate ion exchanged water and methanol generated by hydrolytic condensation. Accordingly, a hydrolysis-condensation product (A-7) was obtained. The solid content concentration of the hydrolysis-condensation product (A-7) was 40.0% by mass, and the number average molecular weight (Mn) of the obtained hydrolysis-condensation product was 1,800, with a molecular weight distribution (Mw/Mn) of 2. In addition, the content of the aryl groups (phenyl groups) relative to Si atoms in the hydrolysis-condensation product (A-7) was 65% by mole.

Synthesis Example 8

In a vessel equipped with a stirrer was charged 139.4 g of diacetone alcohol, and subsequently 128.9 g of phenyltrimethoxysilane (0.65 mol), 34.1 g of methyltrimethoxysilane (0.25 mol) and 23.6 g of 3-glycidoxypropyltrimethoxysilane (manufactured by Shin-Etsu Chemical Co., Ltd., "KBM-403") (0.1 mol) were charged thereto. The mixture was stirred at room temperature. Next, 0.8 g of tri-1-propoxy aluminum was charged, and the mixture was heated until the solution temperature became 60° C. After the solution temperature reached 60° C., 54 g of ion exchanged water was charged, and the mixture was heated until the solution temperature became 75° C. and kept for 3 hrs. Next, 159 g of methyl orthoformate as a dehydrating agent was added, and the mixture was stirred for 1 hour. Then, the solution temperature was lowered to 40° C., and evaporation was executed while keeping the temperature to eliminate ion exchanged water and methanol generated by hydrolytic condensation. Accordingly, a hydrolysis-condensation product (A-8) was obtained. The solid content concentration of the hydrolysis-condensation product (A-8) was 40.3% by mass, and the number average molecular weight (Mn) of the obtained hydrolysis-condensation product was 1,500, with a molecular weight distribution (Mw/Mn) of 2. In addition, the content of the aryl groups (phenyl groups) relative to Si atoms in the hydrolysis-condensation product (A-8) was 65% by mole.

Synthesis Example 9

In a vessel equipped with a stirrer was charged 139.4 g of diacetone alcohol, and subsequently 128.9 g of phenyltrimethoxysilane (0.65 mol), 34.1 g of methyltrimethoxysilane (0.25 mol) and 24.8 g of 3-methacryloxypropyltrimethoxysilane (manufactured by Shin-Etsu Chemical Co., Ltd., "KBM-503") (0.1 mol) were charged thereto. The mixture was stirred at room temperature, and then a phosphoric acid aqueous solution prepared by dissolving 0.18 g of phosphoric acid in 54 g of ion exchanged water was added dropwise thereto. The mixture was heated until the solution temperature became 40° C., further heated until the solution temperature became 100° C. over 1 hour, and then stirred while heating to keep this temperature for 2 hrs. Thereafter, the solution temperature was lowered to 40° C., and evaporation was executed while keeping the temperature to eliminate ion exchanged water and methanol generated by hydrolytic condensation. Accordingly, a hydrolysis-condensation product (A-9) was obtained. The solid content concentration of the hydrolysis-condensation product (A-9) was 40.0% by mass, and the number average molecular weight (Mn) of the obtained hydrolysis-condensation product was 1,800, with a molecular weight distribution (Mw/Mn) of 2. In addition, the content of the aryl groups (phenyl groups) relative to Si atoms in the hydrolysis-condensation product (A-9) was 65% by mole.

Synthesis Example 10

In a vessel equipped with a stirrer was charged 139.4 g of diacetone alcohol, and subsequently 69.4 g of phenyltrimethoxysilane (0.35 mol) and 88.5 g of methyltrimethoxysilane (0.65 mol) were charged thereto. The mixture was stirred at room temperature, and then a phosphoric acid aqueous solution prepared by dissolving 0.18 g of phosphoric acid in 54 g of ion exchanged water was added dropwise thereto. The mixture was heated until the solution temperature became 40° C., further heated until the solution temperature became 100° C. over 1 hour, and then stirred while heating to keep this temperature for 2 hrs. Thereafter, the solution temperature was lowered to 40° C., and evaporation was executed while keeping the temperature to eliminate ion exchanged water and methanol generated by hydrolytic condensation. Accordingly, a hydrolysis-condensation product (A-10) was obtained. The solid content concentration of the hydrolysis-condensation product (A-10) was 40.5% by mass, and the number average molecular weight (Mn) of the obtained hydrolysis-condensation product was 2,500, with a molecular weight distribution (Mw/Mn) of 2. In addition, the content of the aryl groups relative to Si atoms in the hydrolysis-condensation product (A-10) was 35% by mole.

Synthesis Example 11

In a vessel equipped with a stirrer was charged 139.4 g of diacetone alcohol, and subsequently 109.1 g of phenyltrimethoxysilane (0.55 mol) and 61.3 g of methyltrimethoxysilane (0.45 mol) were charged thereto. The mixture was stirred at room temperature, and then a phosphoric acid aqueous solution prepared by dissolving 0.18 g of phosphoric acid in 54 g of ion exchanged water was added dropwise thereto. The mixture was heated until the solution temperature became 40° C., further heated until the solution temperature became 100° C. over 1 hour, and then stirred while heating to keep this temperature for 2 hrs. Thereafter, the solution temperature was lowered to 40° C., and evaporation was executed while keeping the temperature to eliminate ion exchanged water and methanol generated by hydrolytic condensation. Accordingly, a hydrolysis-condensation product (A-11) was obtained. The solid content concentration of the hydrolysis-condensation product (A-11) was 41.2% by mass, and the number average molecular weight (Mn) of the obtained hydrolysis-condensation product was 2,700, with a molecular weight distribution (Mw/Mn) of 2. In addition, the content of the phenyl groups relative to Si atoms in the hydrolysis-condensation product (A-11) was 55% by mole.

<Preparation of Radiation Sensitive Resin Composition>

Example 1

To a solution containing the hydrolysis-condensation product (A-1) obtained in Synthesis Example 1 in an amount corresponding to 100 parts by mass (solid content) of the hydrolysis-condensation product (A-1) were added as the component (B) 12 parts by mass of (B-1) a condensate of 4,4'-[1-[4-[1-[4-hydroxyphenyl]-1-methylethyl]phenyl]ethylidene]bisphenol (1.0 mol) and 1,2-naphthoquinone diazide-5-sulfonic acid chloride (3.0 mol), and as the surface active agent (F) 0.1 parts by mass of a fluorinated surface active agent (manufactured by NEOS Co., Ltd., "FTX-218"). Propylene glycol monomethyl ether was added thereto such that the solid content concentration became 25% by mass to prepare a positive-type radiation-sensitive composition.

Examples 2 to 17 and Comparative Examples 1 to 8

Positive-type radiation-sensitive compositions were prepared in a similar manner to Example 1 except that the type and the amount of each component were as shown in Table 1.

<Evaluation of Physical Properties>

Using the positive-type radiation-sensitive composition prepared as described above, various characteristics as the composition, and as an interlayer insulating film and a liquid crystal cell were evaluated as in the following.

[Evaluation of Radiation Sensitivity of the Positive-Type Radiation-Sensitive Composition]

With respect to Examples 1 to 3 and 5 to 17, and Comparative Examples 1 to 8, each composition was applied on a silicon substrate using a spinner, and thereafter prebaked at 100° C. for 2 min on a hot plate to form a coating film having a film thickness of 4.0 μm. With respect to Example 4, the composition was applied using a slit die coater, and thereafter subjected to vacuum pressure at room temperature over 15 sec until the pressure reached 0.5 Torr to remove the solvent, followed by prebaking at 100° C. for 2 min on a hot plate to form a coating film having a film thickness of 4.0 μm. Thus obtained coating film was exposed using a PLA-501F Mask Aligner manufactured by Canon, Inc. (super-high pressure mercury lamp) through a mask having a pattern with 3.0-μm lines and spaces (10 vs. 1) with varying exposure time. Thereafter, development was carried out with a puddle method using 2.38% by mass TMAH aqueous solution at 25° C. for 80 sec. Next, washing with running ultrapure water for 1 min was followed by drying to form the pattern on the silicon substrate. In this procedure, a minimum light exposure required for making the spaces line width of 0.30 μm at the bottom was determined. This minimum light exposure is shown in Table 1 in terms of the radiation sensitivity. When the minimum light exposure is no greater than 600 ($J/m^2$), it may be concluded that favorable radiation sensitivity was achieved.

[Evaluation of Pencil Hardness (Surface Hardness) of Interlayer Insulating Film]

A coating film was formed in a similar manner to the aforementioned "Evaluation of Radiation Sensitivity of the Positive-type radiation-sensitive composition" except that the exposure was not carried out, and then post-prebaking was carried out in a clean oven at 220° C. for 1 hour. Thereafter, a cured film was formed on a silicon substrate. According to JIS K-5400-1990, 8.4.1: Pencil Scratch Test, the pencil hardness (surface hardness) of the cured film was measured. The results are shown in Table 1. When this value is 3H or greater, it may be concluded that favorable surface hardness of the cured film was achieved.

[Evaluation of Refractive Index of Interlayer Insulating Film]

In a similar manner to the aforementioned "Evaluation of Pencil Hardness (Surface Hardness) of Interlayer Insulating Film", a cured film was formed on a silicon substrate. The refractive index of thus obtained cured film was measured on an Auto EL IV NIR III ellipsometer (manufactured by Rudolf Research Co., Ltd.) at 633 nm. When this value is no less than 1.50, it may be concluded that the refractive index as an interlayer insulating film is at a satisfactory level for practical applications.

[Evaluation of Heat Resistance of Interlayer Insulating Film]

In a similar manner to the aforementioned "Evaluation of Pencil Hardness (Surface Hardness) of Interlayer Insulating Film", a cured film was formed on a silicon substrate, and the film thickness (T2) of thus obtained cured film was measured. Next, the silicon substrate on which the cured film was formed was additionally baked in a clean oven at 240° C. for 1 hour, and thereafter the film thickness (t2) of the cured film was measured. Thus, the rate of change of the film thickness $\{|t2-T2|/T2\} \times 100 [\%]$ resulting from the additional baking was calculated. The results are shown in Table 1. When this value is no greater than 3%, it may be concluded that favorable heat resistance was achieved.

[Evaluation of Light Transmittance of Interlayer Insulating Film]

In a similar manner to the aforementioned "Evaluation of Radiation Sensitivity", a coating film was formed on a glass substrate. Thus obtained coating film was each exposed using a PLA-501F Parallel Light Mask Aligner manufactured by Canon, Inc. (super-high pressure mercury lamp) such that the integral irradiation became 3,000 $J/m^2$, followed by heating in a clean oven at 220° C. for 1 hour to obtain a cured film. The light transmittance of the glass substrate having this cured film was measured using a spectrophotometer "Model 150-20, double beam" (manufactured by Hitachi, Co., Ltd.) in the wavelength range of 400 to 800 nm. The minimum light transmittance value in this procedure is shown in Table 1. When the minimum light transmittance is no less than 95%, it may be concluded that favorable light transmittance was attained.

[Evaluation of Contamination in a Liquid of Positive-Type Radiation-Sensitive Composition]

Solid contamination having a size of no smaller than 0.5 μm present in a liquid of the positive-type radiation-sensitive composition which had been stored at 5° C. for 7 days was determined using a light scattering type Liquid-Borne Particle Sensor (manufactured by RION Co., Ltd., "KS-28B"). When the compatibility of the component (A) and the component (B) is low, the component (B) is likely to be deposited as solid contamination, whereby contamination in a liquid tends to increase with the passage of time. When a cured film is formed using such a positive-type radiation-sensitive composition having a tendency to increase the solid contamination, the solid contamination causes scattering in the cured film, thereby leading to opacification of the entire cured film. Therefore, evaluation of the contamination in a liquid over time can provide an indicator for deciding the compatibility of the component (A) and the component (B), and suppression level of whitening of the cured film. When the solid contamination having a size of no smaller than 0.5 μm being present in a liquid of the positive-type radiation-sensitive composition is no more than 80 counts/ml after storing at 5° C. for 7 days, it may be concluded that the compatibility of the component (A) and the component (B) is favorable.

[Evaluation of Resistance of Interlayer Insulating Film to Resist Remover Solution]

The resist remover solution resistance of the interlayer insulating film was evaluated according to the following steps.

(1) Formation of Cured Film

In a similar manner to the aforementioned "Evaluation of Pencil Hardness (Surface Hardness) of Interlayer Insulating Film", a cured film was formed on a silicon substrate.

(2) Formation of ITO Film on the Cured Film

ITO sputtering was performed on a high speed sputtering system SH-550-C12 manufactured by Japan Vacuum Engineering Company (currently, Ulvac, Inc.) using an ITO target (ITO filling rate: no less than 95%, $In_2O_3/SnO_2$=90/10 (mass ratio)) at 60° C. The atmosphere in this process involved: degree of reduced pressure of $1.0 \times 10^{-5}$ Pa, Ar gas flow rate of $3.12 \times 10^{-3}$ $m^3/Hr$, and $O_2$ gas flow rate of $1.2 \times 10^{-5}$ $m^3/Hr$. The substrate after completing the sputtering was heated in the aforementioned clean oven at 240° C. for 60 min to allow for annealing.

(3) Formation of Resist Pattern on the ITO Film

Next, the substrate was placed in a spinner, and a positive resist for G-ray, PFR3650-21 cp manufactured by JSR Corporation was dripped on the substrate, and coating was carried out at 3,500 rpm for 30 sec. The substrate was heated at 90° C. for 2 min on a hot plate to remove the solvent. Thereafter, using a Mask Aligner, Canon PLA501F (manufactured by Canon Inc.), g, h, i-rays (intensity ratio at wavelengths of 436 nm, 405 nm and 365 nm being 2.7: 2.5: 4.8) were irradiated with an illuminance of 23 $mW/m^2$ in terms of i-ray basis, and a light exposure of 25 $mJ/m^2$ through a 10 μm/10 μm pattern mask. Subsequently, immersion development was carried out using 2.4% TMAH aqueous solution at room temperature for 60 sec. The substrate was rinsed with ultrapure water for 60 sec, followed by air-drying. Accordingly, a 10 μm/10 μm line-and-space pattern was formed.

(4) Etching of the ITO Film

As an etchant, a mixture of nitric acid/hydrochloric acid at a weight ratio of 1/3 was used. The substrate produced in the above step (3) was immersed in the etchant for 60 sec, whereby the ITO film not having the resist pattern was etched.

(5) Removal of the Resist

The substrate having the ITO film etched in the above step (4) was immersed in a resist remover solution TOK-106 (manufactured by Tokyo Ohka Kogyo Co., Ltd.) warmed to 70° C. for 10 min, followed by washing with water. Thereafter, the substrate was further heated in an oven at 210° C. for 15 min to dryness, whereby the resist was removed.

According to the foregoing steps, the film thicknesses were measured when the ITO film was formed on the cured film in the above step (2), and after the resist was removed in the above step (5). Thus, provided that the change in the film thickness from the former to the latter is less than 5%, it is concluded that less swelling of the cured film occurred owing to the resist remover solution, suggesting favorable resist remover solution resistance. The change in the film thickness of less than 10% makes the basis for deciding that the resist remover solution resistance is somewhat favorable, whereas the change in the film thickness of no less than 10% makes the basis for deciding that the resist remover solution resistance is unfavorable. Accordingly, evaluation was made as: (A) when the change in the film thickness of the cured film was less than 5%; (B) when the change was less than 10%; and (C) when the change was no less than 10%. The results are shown in Table 1.

[Evaluation of Dry Etching Resistance of Interlayer Insulating Film]

In a similar manner to the aforementioned "Evaluation of Pencil Hardness (Surface Hardness) of Interlayer Insulating Film", a cured film was formed on a silicon substrate, and dry etching was carried out using a dry etching equipment CDE-80N (manufactured by Shibaura Mechatronics Corporation), under the conditions of: $CF_4$ 50 ml/min and $O_2$ 10 ml/min of etching gas; output of 400 mW; and etching time of 90 sec. Thus, the film thicknesses before and after the treatment were measured. The results are shown in Table 1. When the decrease in the film thickness is less than 1.0 µm, it may be concluded that favorable dry etching resistance was achieved.

[Evaluation of Relative Permittivity of Interlayer Insulating Film]

With respect to Examples 1 to 3 and 5 to 17, and Comparative Examples 1 to 8, each composition was applied using a spinner on a SUS304 substrate which had been polished, and thereafter prebaked at 100° C. for 2 min on a hot plate to form a coating film having a film thickness of 3.0 µm. With respect to Example 4, the composition was applied using a slit die coater, and thereafter subjected to vacuum pressure at room temperature over 15 sec until the pressure reached 0.5 Torr to remove the solvent, followed by prebaking at 100° C. for 2 min on a hot plate to form a coating film having a film thickness of 3.0 µm. Thus obtained coating film was exposed using a PLA-501F Parallel Light Mask Aligner manufactured by Canon, Inc. (super-high pressure mercury lamp) such that the integral irradiation became 3,000 J/m², followed by heating in a clean oven at 220° C. for 1 hour to form a cured film on the substrate. A Pt/Pd electrode pattern was formed on the cured film by a vacuum evaporation method, and a sample for measuring relative permittivity. Thus obtained sample was subjected to measurement of the relative permittivity at a frequency of 10 kHz by a CV method using a HP16451B Electrode and a HP4284A Precision LCR Meter manufactured by Yokogawa-Hewlett Packard CO., Ltd. The results are shown in Table 1. It is to be noted that the development step was skipped in evaluating the relative permittivity since the patterning of the formed film is not necessary, and the substrate was subjected to the evaluation after carrying out only the coating film formation step, the radiation irradiation step and the heating step.

[Evaluation of Voltage Holding Ratio of Liquid Crystal Cell]

Each composition shown in Table 1 was applied using a spinner on a soda glass substrate having an $SiO_2$ film formed on the surface thereof for preventing elution of sodium ion, and further having an ITO (indium-tin oxide alloy) electrode to provide a predetermined shape by vacuum evaporation. Prebaking was carried out on a hot plate at 100° C. for 2 min to form a coating film having a film thickness of 2.0 µm. Development was carried out with a dipping method in 2.38% TMAH aqueous solution at 25° C. for 80 sec. Next, the coating film was subjected to exposure with a radiation including each wavelength of 365 nm, 405 nm and 436 nm using a high pressure mercury lamp at an integral irradiation of 3,000 J/m², without using a photomask. Moreover, postbaking was carried out at 220° C. for 1 hour to form a cured film. Next, a bead spacer having a diameter of 5.5 µm was allowed to disperse on the substrate having the cured film. This substrate was thereafter opposed to a soda glass substrate only having a vacuum-evaporated ITO electrode to give a predetermined shape on the surface thereof. In such a state, both substrates were bonded at four sides using a sealing agent that includes admixed 0.8-mm glass beads so as not to bond the liquid crystal injection port. After injecting a liquid crystal MLC6608 (trade name) manufactured by Merck & Co., Inc., the liquid crystal injection port was sealed to produce a liquid crystal cell.

This liquid crystal cell was placed in a 60° C. thermostatic chamber, and the voltage holding ratio of liquid crystal cell was measured using a liquid crystal voltage holding ratio Measurement System Model VHR-1A (trade name) manufactured by TOYO Corporation, with a square wave having an applied voltage of 5.5 V at a measurement frequency of 60 Hz. The results are shown in Table 1. Note that the voltage holding ratio herein is a value determined according to the following formula. As the value of the voltage holding ratio of a liquid crystal cell is lower, a defect referred to as "burning-in" is more likely to occur when a liquid crystal panel is formed. On the other hand, as the value of the voltage holding ratio is higher, the "burning-in" is less likely to occur, which may be concluded as providing higher reliability of the liquid crystal panel.

Voltage holding ratio (%)=(potential difference of the liquid crystal cell at 16.7 msec after the base time)/(voltage applied at 0 msec [base time])×100

In Table 1, abbreviations of (B) quinone diazide compound, (C) thermosensitive acid generator or thermosensitive base generator, (D) thermally crosslinkable compound, and (F) surface active agent represent the following compounds, respectively.

B-1: condensate of 4,4'-[1-[4-[1-(4-hydroxyphenyl)-1-methylethyl]phenyl]ethylidene]bisphenol (1.0 mol) and 1,2-naphthoquinone diazide-5-sulfonic acid chloride (3.0 mol)

B-2: condensate of 1,1,1-tri(p-hydroxyphenyl)ethane (1.0 mol) and 1,2-naphthoquinone diazide-5-sulfonic acid chloride (3.0 mol)

C-1: benzyl-4-hydroxyphenylmethylsulfonium hexafluorophosphate

C-2: 2-nitrobenzylcyclohexylcarbamate

C-3: 1-(4,7-dibutoxy-1-naphthalenyl)tetrahydrothiophenium trifluoromethanesulfonate C-4: N-(trifluoromethylsulfonyloxy)naphthyldicarboxylimide (manufactured by Midori Kagaku Co., Ltd., "NAI-105")

D-1: 1,3,4,6-tetrakis(methoxymethyl)glycoluril (manufactured by SANWA Chemical Co., Ltd, "Nikaluck MX-270")

D-2: 3-glycidoxypropyltrimethoxysilane

D-3: tris-(3-trimethoxysilylpropyl)isocyanurate (manufactured by Shin-Etsu Chemical Co., Ltd., "X-12-965")

F-1: fluorochemical surfactant (manufactured by NEOS Co., Ltd., "FTX-218")

TABLE 1

| | | Example 1 | 2 | 3 | 4 | 5 | 6 | 7 | 8 | 9 | 10 | 11 | 12 | 13 |
|---|---|---|---|---|---|---|---|---|---|---|---|---|---|---|
| Component (A) | A-1 (parts by mass) | 100 | | | | | | | | | | | | |
| | A-2 (parts by mass) | | 100 | | | | | | | | | | | |
| | A-3 (parts by mass) | | | 100 | 100 | 100 | 100 | 100 | 100 | 100 | | | | |
| | A-4 (parts by mass) | | | | | | | | | | 100 | | | |
| | A-5 (parts by mass) | | | | | | | | | | | 100 | | |
| | A-6 (parts by mass) | | | | | | | | | | | | 100 | |
| | A-7 (parts by mass) | | | | | | | | | | | | | 100 |
| | A-8 (parts by mass) | | | | | | | | | | | | | |
| | A-9 (parts by mass) | | | | | | | | | | | | | |
| | A-10 (parts by mass) | | | | | | | | | | | | | |
| | A-11 (parts by mass) | | | | | | | | | | | | | |
| Component (B) | B-1 (parts by mass) | 12 | 12 | 12 | 12 | 12 | 12 | 12 | 12 | 12 | 12 | 15 | 15 | 15 |
| | B-2 (parts by mass) | | | | | | | | | | | | | |
| Component (C) | C-1 (parts by mass) | | | | | | 0.2 | | | | | | 0.2 | |
| | C-2 (parts by mass) | | | | | 0.2 | | | | | | | | |
| | C-3 (parts by mass) | | | | 0.2 | | | | | | 0.5 | 0.2 | | 0.2 |
| | C-4 (parts by mass) | | | 0.2 | | | | | 0.2 | 0.2 | 0.3 | | | |
| Component (D) | D-1 (parts by mass) | | | | | | | 2 | | | | | | 3 |
| | D-2 (parts by mass) | | | | | | | | 2 | | 3 | 3 | 3 | |
| | D-3 (parts by mass) | | | | | | | | | 2 | | | | |
| Component (F) | F-1 (parts by mass) | 0.1 | 0.1 | 0.1 | 0.1 | 0.1 | 0.1 | 0.1 | 0.1 | 0.1 | 0.1 | 0.1 | 0.1 | 0.1 |
| Radiation sensitivity (J/m$^2$) | | 600 | 600 | 600 | 600 | 600 | 600 | 600 | 600 | 600 | 600 | 500 | 500 | 500 |
| Surface hardness | | 3H | 3H | 3H | 3H | 3H | 3H | 3H | 3H | 3H | 3H | 3H | 3H | 4H |
| Refractive index | | 1.53 | 1.53 | 1.52 | 1.53 | 1.53 | 1.53 | 1.53 | 1.53 | 1.53 | 1.53 | 1.53 | 1.53 | 1.53 |
| Heat resistance (%) | | 3 | 3 | 3 | 3 | 3 | 3 | 3 | 3 | 3 | 3 | 3 | 3 | 3 |
| Light transmittance (%) | | 98 | 98 | 98 | 98 | 98 | 98 | 98 | 98 | 98 | 98 | 97 | 97 | 97 |
| Contamination in liquid (counts/ml) | | 50 | 50 | 70 | 50 | 50 | 50 | 60 | 70 | 60 | 70 | 50 | 40 | 70 |
| Resistance of Resist remover solution | | A | A | A | A | A | A | A | A | A | A | A | A | A |
| Dry etching resistance (μm) | | 0.85 | 0.84 | 0.77 | 0.78 | 0.85 | 0.84 | 0.81 | 0.83 | 0.78 | 0.76 | 0.83 | 0.81 | 0.87 |
| Relative permittivity | | 3 | 3 | 3 | 3 | 3 | 3 | 3 | 3 | 3 | 3 | 3 | 3 | 3 |
| Voltage holding ratio of liquid crystal cell (%) | | 98 | 97 | 97 | 97 | 97 | 97 | 97 | 98 | 98 | 98 | 98 | 97 | 96 |

| | | Example 14 | 15 | 16 | 17 | Comparative Example 1 | 2 | 3 | 4 | 5 | 6 | 7 | 8 |
|---|---|---|---|---|---|---|---|---|---|---|---|---|---|
| Component (A) | A-1 (parts by mass) | | | | | | | | | | | | |
| | A-2 (parts by mass) | | | | | | | | | | | | |
| | A-3 (parts by mass) | | | | | | | | | | | | |
| | A-4 (parts by mass) | | | | | | | | | | | | |
| | A-5 (parts by mass) | | | | | | | | | | | | |
| | A-6 (parts by mass) | | | | | | | | | | | | |
| | A-7 (parts by mass) | | | | | | | | | | | | |
| | A-8 (parts by mass) | 100 | | 100 | 100 | | | | | | | | |

TABLE 1-continued

|  |  | | | | | | | | | | | | |
|---|---|---|---|---|---|---|---|---|---|---|---|---|---|
| | A-9 (parts by mass) | | 100 | | | | | | | | | | |
| | A-10 (parts by mass) | | | | | 100 | 100 | 100 | 100 | 100 | 100 | | |
| | A-11 (parts by mass) | | | | | | | | | | | 100 | 100 |
| Component (B) | B-1 (parts by mass) | 15 | | | 15 | 8 | | 12 | 12 | 12 | 12 | | 12 |
| | B-2 (parts by mass) | | 15 | 15 | | | 8 | | | | | 8 | |
| Component (C) | C-1 (parts by mass) | | | | | | | | | | | | |
| | C-2 (parts by mass) | | | | | | | | | | | | |
| | C-3 (parts by mass) | | 0.2 | 0.2 | 0.2 | | | | | | | | |
| | C-4 (parts by mass) | | | | | | | 0.2 | | 0.3 | 0.3 | | 0.2 |
| Component (D) | D-1 (parts by mass) | 2 | | | | | | | 2 | | | | |
| | D-2 (parts by mass) | | 2 | | 2 | | | | | | 2 | | |
| | D-3 (parts by mass) | | | 2 | | | | | 2 | | | | |
| Component (F) | F-1 (parts by mass) | 0.1 | 0.1 | 0.1 | 0.1 | 0.1 | 0.1 | 0.1 | 0.1 | 0.1 | 0.1 | 0.1 | 0.1 |
| Radiation sensitivity (J/m$^2$) | | 400 | 500 | 500 | 500 | 600 | 600 | 600 | 600 | 600 | 600 | 600 | 600 |
| Surface hardness | | 4H | 4H | 4H | 4H | 3H | 3H | 3H | 3H | 3H | 3H | 3H | 3H |
| Refractive index | | 1.52 | 1.52 | 1.52 | 1.52 | 1.45 | 1.44 | 1.43 | 1.43 | 1.44 | 1.43 | 1.47 | 1.47 |
| Heat resistance (%) | | 2.5 | 2.5 | 2.5 | 2.5 | 3 | 3 | 3 | 3 | 3 | 3 | 3 | 3 |
| Light transmittance (%) | | 97 | 97 | 97 | 98 | 98 | 98 | 98 | 98 | 98 | 98 | 98 | 98 |
| Contamination in liquid (counts/ml) | | 50 | 50 | 70 | 70 | 150 | 200 | 200 | 150 | 200 | 200 | 100 | 100 |
| Resistance of Resist remover solution | | A | A | A | A | C | C | C | C | B | B | B | B |
| Dry etching resistance (μm) | | 0.78 | 0.77 | 0.86 | 0.81 | 1.32 | 1.25 | 1.31 | 1.24 | 1.26 | 1.33 | 1.05 | 1.11 |
| Relative permittivity | | 3 | 3 | 3 | 3 | 3.2 | 3.2 | 3.2 | 3.2 | 3.1 | 3.1 | 3.1 | 3.1 |
| Voltage holding ratio of liquid crystal cell (%) | | 96 | 96 | 96 | 95 | 96 | 96 | 95 | 95 | 96 | 96 | 96 | 95 |

As is clear from the results shown in Table 1, it was proven that the positive-type radiation-sensitive compositions of Example 1 to 17 which contain the component (A) and the component (B), in which the content of aryl groups (phenyl groups) relative to Si atoms in the siloxane polymer as the component (A) is greater than 60% by mole and no greater than 95% by mole can form an interlayer insulating film that satisfies generally demanded characteristics, i.e., heat resistance, transparency and low dielectricity, in a well balanced manner, and that is superior in the refractive index, resist remover solution resistance in ITO film etching steps, and dry etching resistance. In addition, it was also proven that a liquid crystal panel having a high voltage holding ratio can be formed. Moreover, the positive-type radiation-sensitive compositions of these Examples had high radiation sensitivity, and exhibited superior compatibility of the component (A) and the component (B). Additionally, according to Examples 13 to 17 in which 2-(3,4-epoxycyclohexyl)ethyltrimethoxysilane, 3-glycidoxypropyltrimethoxysilane or 3-methacryloxypropyltrimethoxysilane is used as the compound that constitutes the component (A), in particular, a high surface hardness was attained. On the other hand, the interlayer insulating films obtained in Comparative Examples 1 to 8, in which the content of aryl groups (phenyl groups) relative to Si atoms in the siloxane polymer as the component (A) is no greater than 60% by mole was significantly inferior to each Example in regard to the refractive index, low dielectricity, resist remover solution resistance in ITO film etching steps, and dry etching resistance. Furthermore, the positive-type radiation-sensitive compositions of Comparative Examples 1 to 8 also exhibited inferior compatibility of the component (A) and the component (B).

Industrial Applicability

The positive-type radiation-sensitive composition of the present invention is, as described above, capable of forming an interlayer insulating film having high heat resistance, and low dielectricity, as well as superior refractive index, resist remover solution resistance in ITO film etching steps, and dry etching resistance. Further, the positive-type radiation-sensitive composition of the present invention also capable of forming a liquid crystal cell having a high voltage holding ratio. Therefore, the positive-type radiation-sensitive composition is suitably used for forming an interlayer insulating film for a display devices. Furthermore, this composition can be preferably used also for forming an interlayer insulating film of organic EL device, and flexible displays etc., such as electronic papers.

What is claimed is:

1. A positive-type radiation-sensitive composition comprising
    (A) a siloxane polymer, and
    (B) a quinone diazide compound, wherein
    the content of aryl groups relative to Si atoms in the siloxane polymer (A) is greater than 60% by mole and no greater than 95% by mole.

2. The positive-type radiation-sensitive composition according to claim 1, wherein the siloxane polymer (A) is a hydrolysis-condensation product of a hydrolyzable silane compound comprising at least a compound represented by the following formula (1):

wherein, $R^1$ each independently represents any one of a hydrogen atom, an alkyl group having 1 to 10 carbon atoms, an alkenyl group having 2 to 10 carbon atoms, and an aryl group having 6 to 15 carbon atoms; $R^2$ each independently represents any one of a hydrogen atom, an alkyl group having 1 to 6 carbon atoms, an acyl group having 1 to 6 carbon atoms, and an aryl group having 6 to 15 carbon atoms, where a part or all of hydrogen atoms of the alkyl group, alkenyl group, and alkyl group in $R^1$ and $R^2$ may be substituted; and n represents an integer of 0 to 3.

3. The positive-type radiation-sensitive composition according to claim 2, wherein the siloxane polymer (A) is a hydrolysis-condensation product of (i) a compound represented by the formula (1) wherein: $R^1$ is an aryl group having 6 to 15 carbon atoms; $R^2$ is any of a hydrogen atom, an alkyl group having 1 to 6 carbon atoms, and an acyl group having 1 to 6 carbon atoms; and n represents an integer of 1 to 3, and (ii) a compound represented by the formula (1) wherein: $R^1$ is any one of a hydrogen atom, an alkyl group having 1 to 10 carbon atoms, and an alkenyl group having 2 to 10 carbon atoms; $R^2$ is any one of a hydrogen atom, an alkyl group having 1 to 6 carbon atoms, and an acyl group having 1 to 6 carbon atoms; and n represents an integer of 0 to 3.

4. The positive-type radiation-sensitive composition according to claim 3, further comprising (C) a thermosensitive acid generator or a thermosensitive base generator.

5. The positive-type radiation-sensitive composition according to claim 4, further comprising (D) a thermally crosslinkable compound.

6. The positive-type radiation-sensitive composition according to claim 5 which is used for forming a cured film.

7. A cured film formed from the positive-type radiation-sensitive composition according to claim 5.

8. The cured film according to claim 7, wherein the cured film is an interlayer insulating film of a display device.

9. A display device comprising the interlayer insulating film according to claim 8.

10. The positive-type radiation-sensitive composition according to claim 1, further comprising (C) a thermosensitive acid generator or a thermosensitive base generator.

11. The positive-type radiation-sensitive composition according to claim 10, further comprising (D) a thermally crosslinkable compound.

12. A cured film formed from the positive-type radiation-sensitive composition according to claim 11.

13. The cured film according to claim 12, wherein the cured film is an interlayer insulating film of a display device.

14. A display device comprising the interlayer insulating film according to claim 13.

15. The positive-type radiation-sensitive composition according to claim 2, further comprising (C) a thermosensitive acid generator or a thermosensitive base generator.

16. The positive-type radiation-sensitive composition according to claim 15, further comprising (D) a thermally crosslinkable compound.

17. A cured film formed from the positive-type radiation-sensitive composition according to claim 16.

18. The cured film according to claim 17, wherein the cured film is an interlayer insulating film of a display device.

19. A display device comprising the interlayer insulating film according to claim 18.

* * * * *